(12) United States Patent
Javaheri et al.

(10) Patent No.: US 10,990,020 B2
(45) Date of Patent: Apr. 27, 2021

(54) METROLOGY PARAMETER DETERMINATION AND METROLOGY RECIPE SELECTION

(71) Applicant: ASML NETHERLANDS B.V., Veldhoven (NL)

(72) Inventors: Narjes Javaheri, Eindhoven (NL); Mohammadreza Hajiahmadi, Rotterdam (NL); Olger Victor Zwier, Nuenen (NL); Gonzalo Roberto Sanguinetti, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 2 days.

(21) Appl. No.: 15/964,643

(22) Filed: Apr. 27, 2018

(65) Prior Publication Data

US 2018/0321597 A1 Nov. 8, 2018

Related U.S. Application Data

(60) Provisional application No. 62/501,047, filed on May 3, 2017.

(30) Foreign Application Priority Data

Jan. 19, 2018 (EP) .................... 18152479

(51) Int. Cl.
*G03F 7/20* (2006.01)
*G01M 11/02* (2006.01)
*G01M 11/00* (2006.01)

(52) U.S. Cl.
CPC ......... *G03F 7/70625* (2013.01); *G01M 11/00* (2013.01); *G01M 11/0264* (2013.01); *G03F 7/705* (2013.01); *G03F 7/70633* (2013.01)

(58) Field of Classification Search
CPC .... G01M 11/00; G03F 7/70625; G03F 7/705; G03F 7/70633
See application file for complete search history.

(56) References Cited

U.S. PATENT DOCUMENTS

| 7,791,732 B2 | 9/2010 | Den Boef et al. |
| 2006/0066855 A1 | 3/2006 | Den Boef et al. |

(Continued)

FOREIGN PATENT DOCUMENTS

| JP | 2006060214 | 3/2006 |
| JP | 2008047900 | 2/2008 |

(Continued)

OTHER PUBLICATIONS

International Search Report issued in corresponding PCT Application No. PCT/EP2018/059183, dated Jul. 18, 2018, 3 pages.

(Continued)

*Primary Examiner* — Deoram Persaud
(74) *Attorney, Agent, or Firm* — Pillsbury Winthrop Shaw Pittman LLP

(57) ABSTRACT

A method of determining a patterning process parameter from a metrology target, the method including: obtaining a plurality of values of diffraction radiation from the metrology target, each value of the plurality of values corresponding to a different illumination condition of a plurality of illumination conditions of illumination radiation for the target; and using the combination of values to determine a same value of the patterning process parameter for the target.

23 Claims, 16 Drawing Sheets

(56) References Cited

U.S. PATENT DOCUMENTS

| | | |
|---|---|---|
| 2008/0043239 A1 | 2/2008 | Boef et al. |
| 2009/0296075 A1 | 12/2009 | Hu et al. |
| 2011/0027704 A1 | 2/2011 | Cramer et al. |
| 2011/0043791 A1 | 2/2011 | Smilde et al. |
| 2012/0206703 A1 | 8/2012 | Bhattacharyya et al. |
| 2012/0242940 A1 | 9/2012 | Nagata et al. |
| 2013/0303142 A1 | 11/2013 | Straaijer |
| 2014/0233025 A1 | 8/2014 | Den Boef et al. |
| 2015/0145151 A1 | 5/2015 | Van Der Schaar et al. |
| 2015/0185626 A1 | 7/2015 | Chen et al. |
| 2016/0117847 A1 | 4/2016 | Pandev et al. |
| 2016/0161863 A1* | 6/2016 | Den Boef ............... G03F 7/705 355/67 |
| 2016/0313654 A1 | 10/2016 | Zeng et al. |
| 2017/0052454 A1* | 2/2017 | Jak ..................... G03F 7/70633 |
| 2017/0090302 A1* | 3/2017 | Slotboom ........... G03F 7/70633 |
| 2017/0235232 A1 | 8/2017 | Toshima et al. |
| 2018/0017881 A1* | 1/2018 | Van Der Schaar ......................... G03F 7/70633 |
| 2018/0088470 A1* | 3/2018 | Bhattacharyya .... G03F 7/70633 |
| 2019/0107785 A1* | 4/2019 | Javaheri ............. G03F 7/70633 |
| 2019/0129316 A1* | 5/2019 | Zhou .................. G03F 7/70625 |
| 2019/0155173 A1* | 5/2019 | Tsiatmas ............. G03F 7/70633 |
| 2019/0361358 A1* | 11/2019 | Tel ...................... G03F 7/70625 |
| 2020/0249576 A1* | 8/2020 | Warnaar .............. G03F 7/70633 |

FOREIGN PATENT DOCUMENTS

| | | |
|---|---|---|
| JP | 2009204621 | 9/2009 |
| JP | 2017072861 | 4/2017 |
| TW | 201403257 | 1/2014 |
| WO | 2009/078708 | 6/2009 |
| WO | 2009/106279 | 9/2009 |
| WO | 2011/012624 | 2/2011 |
| WO | 2015/018625 | 2/2015 |
| WO | 2016169901 | 10/2016 |
| WO | 2017/198422 | 11/2017 |

OTHER PUBLICATIONS

Taiwanese Office Action issued in corresponding Taiwanese Patent Application No. 107114625, dated Nov. 13, 2019.

Korean Office Action issued in corresponding Korean Patent Application No. 10-2019-7035138, dated Feb. 23, 2021.

Japanese Office Action issued in corresponding Japanese Patent Application No. 2019-557563, dated Jan. 21, 2021.

* cited by examiner

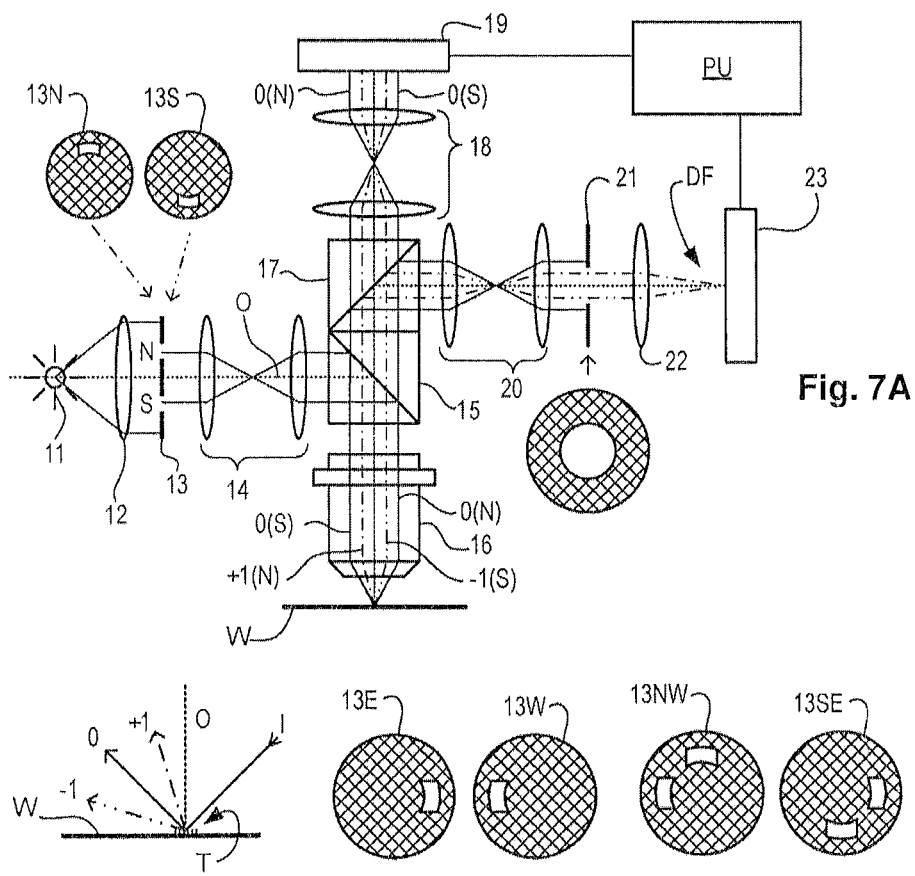
Fig. 7A
Fig. 7B   Fig. 7C   Fig. 7D
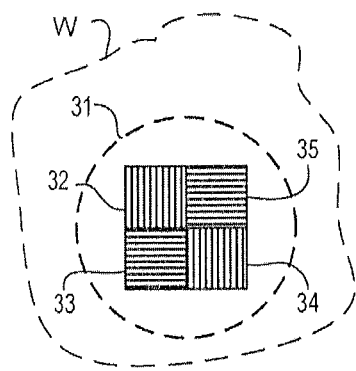
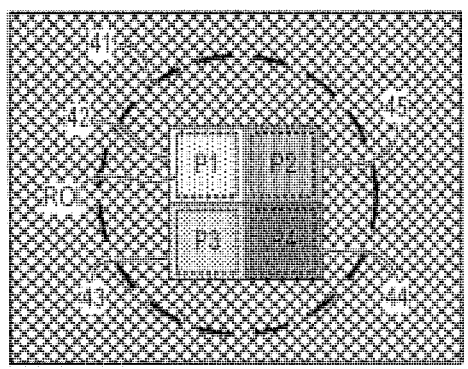
Fig. 8   Fig. 9

METROLOGY PARAMETER DETERMINATION AND METROLOGY RECIPE SELECTION

This application claims the benefit of priority of European patent application no. 18152479, filed on Jan. 19, 2018, and U.S. provisional patent application No. 62/501,047, filed on May 3, 2017. The content of each of the foregoing applications is incorporated herein in its entirety by reference.

FIELD

The present disclosure relates to methods and apparatus for inspection (e.g., metrology) usable, for example, in the manufacture of devices by lithographic techniques and to methods of manufacturing devices using lithographic techniques.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g., including part of, one, or several dies) on a substrate (e.g., a silicon wafer). Transfer of the pattern is typically via imaging onto a layer of radiation-sensitive material (resist) provided on the substrate. In general, a single substrate will contain a network of adjacent target portions that are successively patterned.

Significant aspects to enabling a patterning process (i.e., a process of creating a device or other structure involving patterning (such as lithographic exposure or imprint), which may typically include one or more associated processing steps such as development of resist, etching, etc.) include developing the process itself, setting it up for monitoring and control and then actually monitoring and controlling the process itself. Assuming a configuration of the fundamentals of the patterning process, such as the patterning device pattern(s), the resist type(s), post-lithography process steps (such as the development, etch, etc.), it is desirable to setup the apparatus in the patterning process for transferring the pattern onto the substrates, develop one or more metrology targets to monitor the process, setup up a metrology process to measure the metrology targets and then implement a process of monitoring and/or controlling the process based on measurements.

So, in a patterning process, it is desirable to determine (e.g., measure, simulate using one or more models that model one or more aspects of the patterning process, etc.) one or more parameters of interest, such as the critical dimension (CD) of a structure, the overlay error between successive layers (i.e., the undesired and unintentional misalignment of successive layers) formed in or on the substrate, etc.

It is desirable to determine such one or more parameters of interest for structures created by a patterning process and use them for design, control and/or monitoring relating to the patterning process, e.g., for process design, control and/or verification. The determined one or more parameters of interest of patterned structures can be used for patterning process design, correction and/or verification, defect detection or classification, yield estimation and/or process control.

Thus, in patterning processes, it is desirable frequently to make measurements of the structures created, e.g., for process control and verification. Various tools for making such measurements are known, including scanning electron microscopes, which are often used to measure critical dimension (CD), and specialized tools to measure overlay, a measure of the accuracy of alignment of two layers in a device. Overlay may be described in terms of the degree of misalignment between the two layers, for example reference to a measured overlay of 1 nm may describe a situation where two layers are misaligned by 1 nm.

Various forms of inspection apparatus (e.g., metrology apparatus) have been developed for use in the lithographic field. These devices direct a beam of radiation onto a target and measure one or more properties of the redirected (e.g., scattered) radiation—e.g., intensity at a single angle of reflection as a function of wavelength; intensity at one or more wavelengths as a function of reflected angle; or polarization as a function of reflected angle—to obtain a "spectrum" from which a property of interest of the target can be determined. Determination of the property of interest may be performed by various techniques: e.g., reconstruction of the target by iterative approaches such as rigorous coupled wave analysis or finite element methods; library searches; and principal component analysis.

A further technique is involves having the zeroth order of diffraction (corresponding to a specular reflection) blocked, and only higher orders are processed. Examples of such metrology can be found in PCT patent application publication nos. WO 2009/078708 and WO 2009/106279, which are hereby incorporated by reference in their entirety. Further developments of the technique have been described in U.S. patent application publication nos. US 2011-0027704, US 2011-0043791 and US 2012-0242940, each of which is incorporated herein in its entirety. Such diffraction-based techniques are typically used to measure overlay. The targets for techniques can be smaller than the illumination spot and may be surrounded by product structures on a substrate. A target can comprise multiple periodic structures, which can be measured in one image. In a particular form of such a metrology technique, overlay measurement results are obtained by measuring a target twice under certain conditions, while either rotating the target or changing the illumination mode or imaging mode to obtain separately a normal (e.g., $+1^{st}$) and a complementary (e.g., $-1^{st}$) diffraction order intensities. The intensity asymmetry, a comparison of these diffraction order intensities, for a given target provides a measurement of target asymmetry, that is asymmetry in the target. This asymmetry in the target can be used as an indicator of overlay error.

SUMMARY

In the example of overlay measurement, the techniques above rely on an assumption that overlay (i.e., overlay error and deliberate bias) is the only cause of target asymmetry in the target. Any other asymmetry in the target or the measurement, such as structural asymmetry of features within the periodic structure in an upper and/or lower layer, an asymmetry in the measurement using the sensor, etc., can also cause a measured intensity asymmetry in the $1^{st}$ (or other higher) orders. This intensity asymmetry attributable to such other asymmetry in the target and/or measurement, and which is not related to overlay (including an intentional bias), perturbs the overlay measurement, giving an inaccurate overlay measurement.

In an embodiment, there is provided a method of determining a patterning process parameter from a metrology target, the method comprising: obtaining a plurality of values of diffraction radiation from the metrology target, each value of the plurality of values corresponding to a different illumination condition of a plurality of illumination conditions of illumination radiation for the target; and using the combination of values to determine a same value of the patterning process parameter for the target.

In an embodiment, there is provided a method comprising: using a first patterning process parameter determination technique to determine a first value of a patterning process parameter from a metrology target illuminated by measurement radiation; using a second patterning process parameter determination technique different from the first patterning process parameter determination technique to arrive at a plurality of second values of the patterning process parameter for the metrology target, each second value determined at a different illumination condition of measurement radiation; and identifying, based on the first value and the second values, a measurement radiation illumination condition for a metrology recipe for measurement of the metrology target.

In an embodiment, there is provided a measurement method comprising measuring a metrology target on a substrate according to a metrology recipe as described herein.

In an embodiment, there is provided a metrology apparatus for measuring a parameter of a lithographic process, the metrology apparatus being operable to perform a method as described herein.

In an embodiment, there is provided a non-transitory computer program product comprising machine-readable instructions for causing a processor to cause performance of a method as described herein.

In an embodiment, there is provided a system comprising: an inspection apparatus configured to provide a beam of radiation on two adjacent periodic structures or measurement targets on a substrate and to detect radiation diffracted by the targets to determine a parameter of a patterning process; and a non-transitory computer program as described herein. In an embodiment, the system further comprises a lithographic apparatus comprising a support structure configured to hold a patterning device to modulate a radiation beam and a projection optical system arranged to project the modulated radiation beam onto a radiation-sensitive substrate.

Further features and advantages, as well as the structure and operation of various embodiments, are described in detail below with reference to the accompanying drawings. It is noted that the invention is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS

Embodiments will now be described, by way of example only, with reference to the accompanying drawings in which:

FIG. 7A depicts a schematic diagram of an inspection apparatus (e.g., a dark field scatterometer in this case) configured to measure a target using a first pair of illumination apertures;
FIG. 7B schematically depicts a detail of a diffraction spectrum of a target periodic structure for a given direction of illumination;
FIG. 7C schematically depicts a second pair of illumination apertures providing further illumination modes in using the inspection apparatus of FIG. 7A for diffraction based overlay measurements;
FIG. 7D schematically depicts a third pair of illumination apertures combining the first and second pair of apertures;
FIG. 8 depicts a form of multiple periodic structure target and an outline of a measurement spot on a substrate;
FIG. 9 depicts an image of the target of FIG. 8 obtained in the inspection apparatus of FIG. 7A.

DETAILED DESCRIPTION

Before describing embodiments in detail, it is instructive to present an example environment in which embodiments may be implemented.

Figure 1:
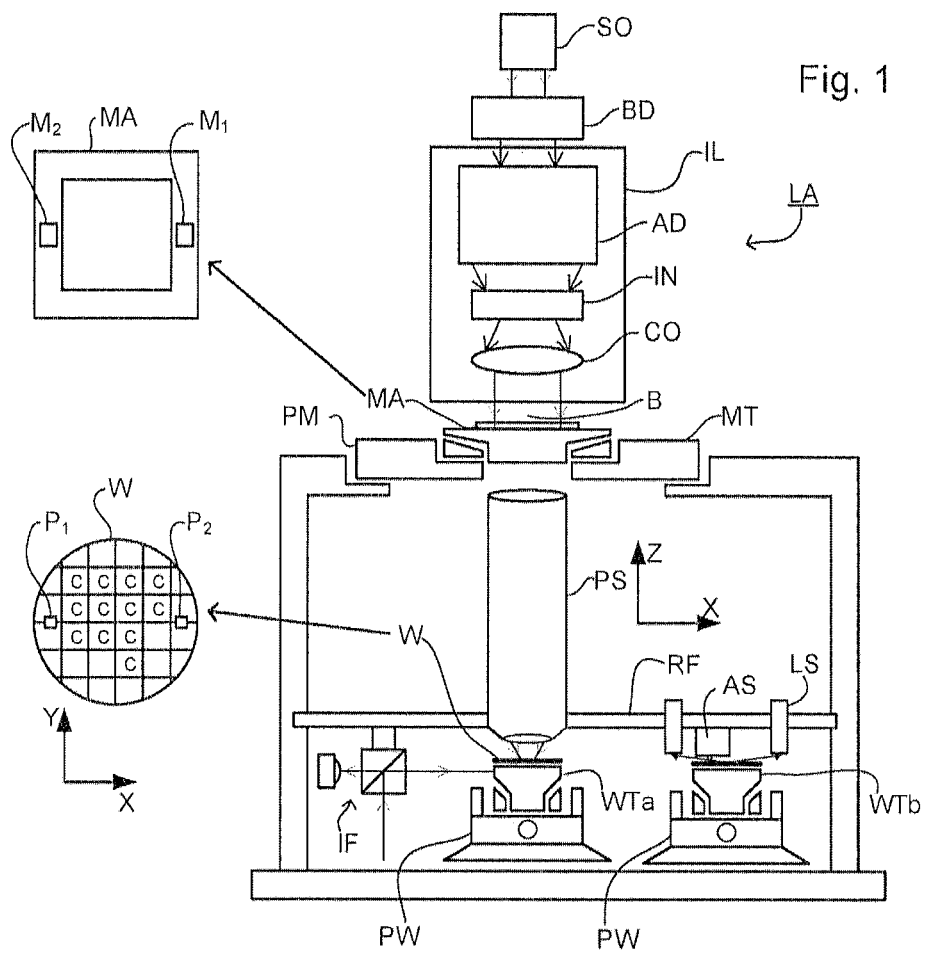
FIG. 1 depicts an embodiment of a lithographic apparatus.

FIG. 1 schematically depicts a lithographic apparatus LA. The apparatus includes an illumination optical system (illuminator) IL configured to condition a radiation beam B (e.g., UV radiation or DUV radiation), a patterning device support or support structure (e.g., a mask table) MT constructed to support a patterning device (e.g., a mask) MA and connected to a first positioner PM configured to accurately position the patterning device in accordance with certain parameters; a substrate table (e.g., a wafer table) WT constructed to hold a substrate (e.g., a resist coated wafer) W and connected to a second positioner PW configured to accurately position the substrate in accordance with certain parameters; and a projection optical system (e.g., a refractive projection lens system) PS configured to project a pattern imparted to the radiation beam B by patterning device MA onto a target portion C (e.g., including one or more dies) of the substrate W.

The illumination optical system may include various types of optical components, such as refractive, reflective, magnetic, electromagnetic, electrostatic or other types of optical components, or any combination thereof, for directing, shaping, or controlling radiation.

The patterning device support holds the patterning device in a manner that depends on the orientation of the patterning device, the design of the lithographic apparatus, and other conditions, such as for example whether or not the patterning device is held in a vacuum environment. The patterning device support can use mechanical, vacuum, electrostatic or other clamping techniques to hold the patterning device. The patterning device support may be a frame or a table, for example, which may be fixed or movable as required. The patterning device support may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam, which is reflected by the mirror matrix.

As here depicted, the apparatus is of a transmissive type (e.g., employing a transmissive mask). Alternatively, the apparatus may be of a reflective type (e.g., employing a programmable mirror array of a type as referred to above, or employing a reflective mask).

The lithographic apparatus may also be of a type wherein at least a portion of the substrate may be covered by a liquid having a relatively high refractive index, e.g., water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may include an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may include various other components, such as an integrator IN and a condenser CO. The illuminator may be used to condition the radiation beam, to have a desired uniformity and intensity distribution in its cross section.

The radiation beam B is incident on the patterning device (e.g., mask) MA, which is held on the patterning device support (e.g., mask table) MT, and is patterned by the patterning device. Having traversed the patterning device (e.g., mask) MA, the radiation beam B passes through the projection optical system PS, which focuses the beam onto a target portion C of the substrate W, thereby projecting an image of the pattern on the target portion C. With the aid of the second positioner PW and position sensor IF (e.g., an interferometric device, linear encoder, 2-D encoder or capacitive sensor), the substrate table WT can be moved accurately, e.g., so as to position different target portions C in the path of the radiation beam B. Similarly, the first positioner PM and another position sensor (which is not explicitly depicted in FIG. 1) can be used to accurately position the patterning device (e.g., mask) MA with respect to the path of the radiation beam B, e.g., after mechanical retrieval from a mask library, or during a scan.

Patterning device (e.g., mask) MA and substrate W may be aligned using patterning device alignment marks $M_1$, $M_2$ and substrate alignment marks $P_1$, $P_2$. Although the substrate alignment marks as illustrated occupy dedicated target portions, they may be located in spaces between target portions (these are known as scribe-lane alignment marks). Similarly, in situations in which more than one die is provided on the patterning device (e.g., mask) MA, the patterning device alignment marks may be located between the dies. Small alignment markers may also be included within dies, in amongst the device features, in which case it is desirable that the markers be as small as possible and not require any different imaging or process conditions than adjacent features. The alignment system, which detects the alignment markers is described further below.

Lithographic apparatus LA in this example is of a so-called dual stage type which has two substrate tables WTa, WTb and two stations—an exposure station and a measurement station—between which the substrate tables can be exchanged. While one substrate on one substrate table is being exposed at the exposure station, another substrate can be loaded onto the other substrate table at the measurement station and various preparatory steps carried out. The preparatory steps may include mapping the surface control of the substrate using a level sensor LS and measuring the position of alignment markers on the substrate using an alignment sensor AS. This enables a substantial increase in the throughput of the apparatus.

The depicted apparatus can be used in a variety of modes, including for example a step mode or a scan mode. The construction and operation of lithographic apparatus is well known to those skilled in the art and need not be described further for an understanding of the embodiments of the present invention.

Figure 2:
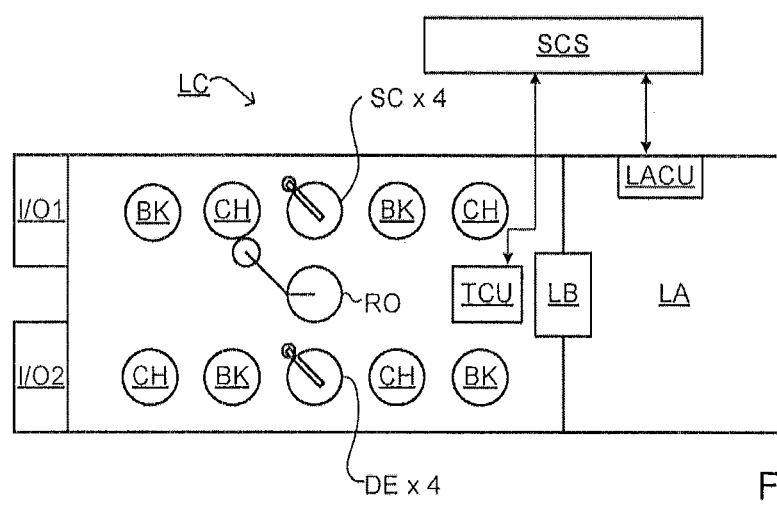
FIG. 2 depicts an embodiment of a lithographic cell or cluster.

As shown in FIG. 2, the lithographic apparatus LA forms part of a lithographic system, referred to as a lithographic cell LC or a lithocell or cluster. The lithographic cell LC may also include apparatus to perform pre- and post-exposure processes on a substrate. Conventionally these include spin coaters SC to deposit resist layers, developers DE to develop exposed resist, chill plates CH and bake plates BK. A substrate handler, or robot, RO picks up substrates from input/output ports I/O1, I/O2, moves them between the different process apparatus and delivers then to the loading bay LB of the lithographic apparatus. These devices, which are often collectively referred to as the track, are under the control of a track control unit TCU which is itself controlled by the supervisory control system SCS, which also controls the lithographic apparatus via lithography control unit LACU. Thus, the different apparatus can be operated to maximize throughput and processing efficiency.

In order to design, monitor, control, etc. the patterning process (e.g., a device manufacturing process) that includes at least one patterning step (e.g., an optical lithography step), the patterned substrate can be inspected and one or more parameters of the patterned substrate are measured. The one or more parameters may include, for example, overlay between successive layers formed in or on the patterned substrate, critical dimension (CD) (e.g., critical linewidth) of, for example, features formed in or on the patterned substrate, focus or focus error of an optical lithography step, dose or dose error of an optical lithography step, optical aberrations of an optical lithography step, etc. This measurement may be performed on a target of the product substrate itself and/or on a dedicated metrology target provided on a substrate. There are various techniques for making measurements of the structures formed in the patterning process, including the use of a scanning electron microscope, image-based measurement or inspection tools and/or various specialized tools. A relatively fast and non-invasive form of specialized metrology and/or inspection tool is one in which a beam of radiation is directed onto a target on the surface of the substrate and properties of the scattered (diffracted/reflected) beam are measured. By comparing one or more properties of the beam before and after it has been scattered by the substrate, one or more properties of the substrate can be determined. This may be termed diffraction-based metrology or inspection.

Figure 3:
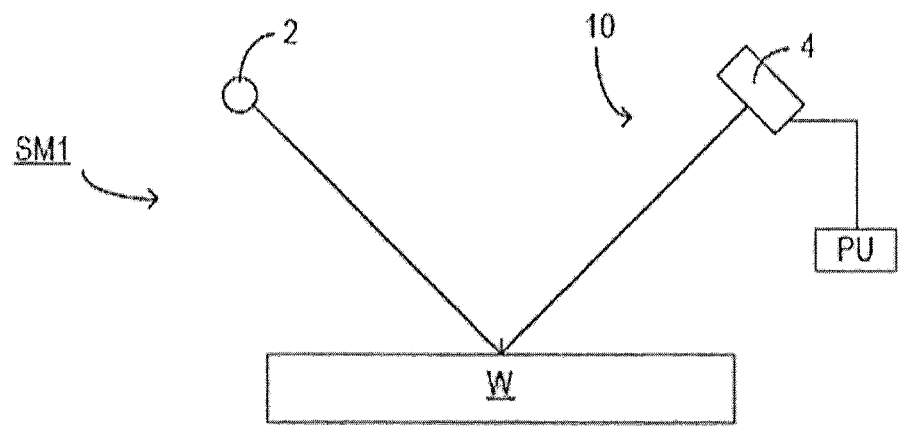
FIG. 3 schematically depicts an example inspection apparatus and metrology technique.
Figure 3:
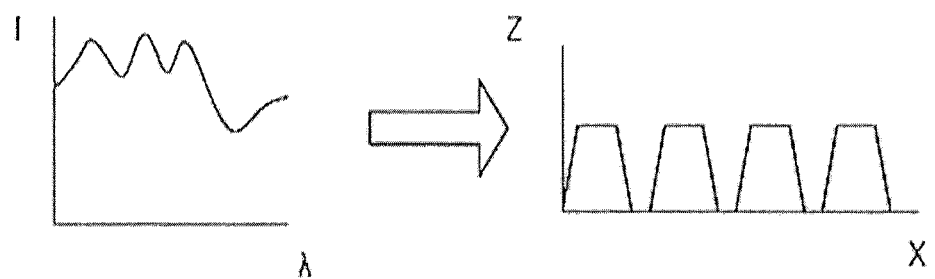

FIG. 3 depicts an example inspection apparatus (e.g., a scatterometer). It comprises a broadband (white light) radiation projector 2 which projects radiation onto a substrate W. The redirected radiation is passed to a spectrometer detector 4, which measures a spectrum 10 (intensity as a function of wavelength) of the specular reflected radiation, as shown, e.g., in the graph in the lower left. From this data, the structure or profile giving rise to the detected spectrum may be reconstructed by processor PU, e.g. by Rigorous Coupled Wave Analysis and non-linear regression or by comparison with a library of simulated spectra as shown at the bottom right of FIG. 3. In general, for the reconstruction the general form of the structure is known and some variables are assumed from knowledge of the process by which the structure was made, leaving only a few variables of the structure to be determined from the measured data. Such an inspection apparatus may be configured as a normal-incidence inspection apparatus or an oblique-incidence inspection apparatus.

Figures 4, 5:
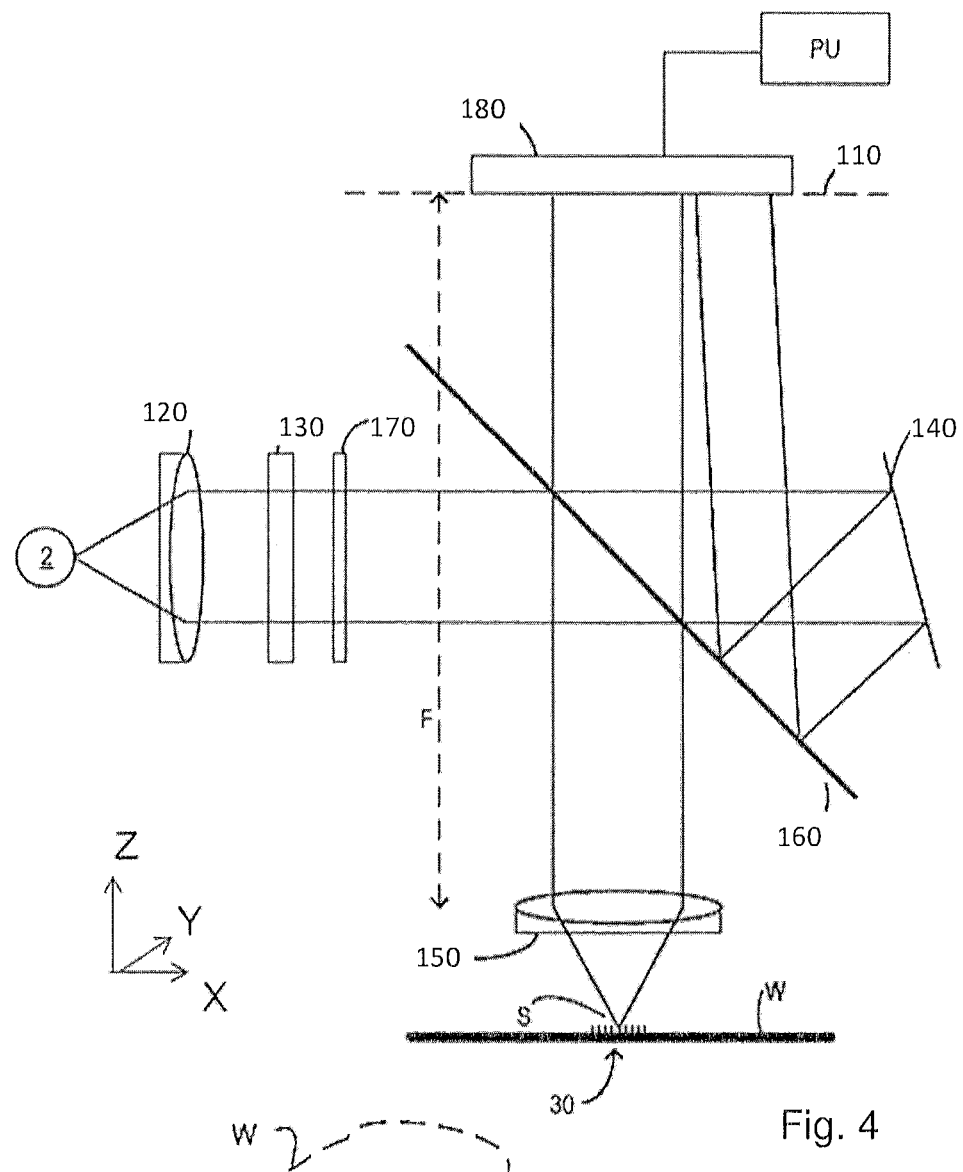
FIG. 4 schematically depicts an example inspection apparatus.
FIG. 5 illustrates the relationship between an illumination spot of an inspection apparatus and a metrology target.

Another inspection apparatus that may be used is shown in FIG. 4. In this device, the radiation emitted by radiation source 2 is collimated using lens system 120 and transmitted through interference filter 130 and polarizer 170, reflected by partially reflecting surface 160 and is focused into a spot S on substrate W via an objective lens 150, which has a high numerical aperture (NA), desirably at least 0.9 or at least 0.95. An immersion inspection apparatus (using a relatively high refractive index fluid such as water) may even have a numerical aperture over 1.

As in the lithographic apparatus LA, one or more substrate tables may be provided to hold the substrate W during measurement operations. The substrate tables may be similar or identical in form to the substrate table WT of FIG. 1. In an example where the inspection apparatus is integrated with the lithographic apparatus, they may even be the same substrate table. Coarse and fine positioners may be provided to a second positioner PW configured to accurately position the substrate in relation to a measurement optical system. Various sensors and actuators are provided for example to acquire the position of a target of interest, and to bring it into position under the objective lens 150. Typically many measurements will be made on targets at different locations across the substrate W. The substrate support can be moved in X and Y directions to acquire different targets, and in the Z direction to obtain a desired location of the target relative to the focus of the optical system. It is convenient to think and describe operations as if the objective lens is being brought to different locations relative to the substrate, when, for example, in practice the optical system may remain substantially stationary (typically in the X and Y directions, but perhaps also in the Z direction) and only the substrate moves. Provided the relative position of the substrate and the optical system is correct, it does not matter in principle which one of those is moving in the real world, or if both are moving, or a combination of a part of the optical system is moving (e.g., in the Z and/or tilt direction) with the remainder of the optical system being stationary and the substrate is moving (e.g., in the X and Y directions, but also optionally in the Z and/or tilt direction).

The radiation redirected by the substrate W then passes through partially reflecting surface 160 into a detector 180 in order to have the spectrum detected. The detector 180 may be located at a back-projected focal plane 110 (i.e., at the focal length of the lens system 150) or the plane 110 may be re-imaged with auxiliary optics (not shown) onto the detector 180. The detector may be a two-dimensional detector so that a two-dimensional angular scatter spectrum of a substrate target 30 can be measured. The detector 180 may be, for example, an array of CCD or CMOS sensors, and may use an integration time of, for example, 40 milliseconds per frame.

A reference beam may be used, for example, to measure the intensity of the incident radiation. To do this, when the radiation beam is incident on the partially reflecting surface 160 part of it is transmitted through the partially reflecting surface 160 as a reference beam towards a reference mirror 140. The reference beam is then projected onto a different part of the same detector 180 or alternatively on to a different detector (not shown).

One or more interference filters 130 are available to select a wavelength of interest in the range of, say, 405-790 nm or even lower, such as 200-300 nm. The interference filter may be tunable rather than comprising a set of different filters. A grating could be used instead of an interference filter. An aperture stop or spatial light modulator (not shown) may be provided in the illumination path to control the range of angle of incidence of radiation on the target.

The detector 180 may measure the intensity of redirected radiation at a single wavelength (or narrow wavelength range), the intensity separately at multiple wavelengths or integrated over a wavelength range. Furthermore, the detector may separately measure the intensity of transverse magnetic- and transverse electric-polarized radiation and/or the phase difference between the transverse magnetic- and transverse electric-polarized radiation.

The target 30 on substrate W may be a 1-D grating, which is printed such that after development, the bars are formed of solid resist lines. The target 30 may be a 2-D grating, which is printed such that after development, the grating is formed of solid resist pillars or vias in the resist. The bars, pillars or vias may be etched into or on the substrate (e.g., into one or more layers on the substrate). The pattern (e.g., of bars, pillars or vias) is sensitive to change in processing in the patterning process (e.g., optical aberration in the lithographic projection apparatus (particularly the projection system PS), focus change, dose change, etc.) and will manifest in a variation in the printed grating. Accordingly, the measured data of the printed grating is used to reconstruct the grating. One or more parameters of the 1-D grating, such as line width and/or shape, or one or more parameters of the 2-D grating, such as pillar or via width or length or shape, may be input to the reconstruction process, performed by processor PU, from knowledge of the printing step and/or other inspection processes.

In addition to measurement of a parameter by reconstruction, diffraction-based metrology or inspection can be used in the measurement of asymmetry of features in product and/or resist patterns. A particular application of asymmetry measurement is for the measurement of overlay, for example, but other applications are also known. In this case, the target 30 typically comprises one set of periodic features superimposed on another. For example, asymmetry can be measured by comparing opposite parts of the diffraction spectrum from the target 30 (for example, comparing the $-1^{st}$ and $+1^{st}$ orders in the diffraction spectrum of a periodic grating). The concepts of asymmetry measurement using the instrument of FIG. 3 or FIG. 4 are described, for example, in U.S. patent application publication US2006-066855, which is incorporated herein in its entirety by reference. Simply stated, while the positions of the diffraction orders in the diffraction spectrum of the target are determined only by the periodicity of the target, asymmetry in the diffraction spectrum is indicative of asymmetry in the individual features which make up the target. In the instrument of FIG. 4, where detector 180 may be an image sensor, such asymmetry in the diffraction orders appears directly as asymmetry in the pupil image recorded by detector 180. This asymmetry can be measured by digital image processing in unit PU, and calibrated against known values of overlay.

FIG. 5 illustrates a plan view of a typical target 30, and the extent of illumination spot S in the apparatus of FIG. 4. To obtain a diffraction spectrum that is free of interference from surrounding structures, the target 30, in an embodiment, is a periodic structure (e.g., grating) larger than the width (e.g., diameter) of the illumination spot S. The width of spot S may be smaller than the width and length of the target. The target in other words is 'underfilled' by the illumination, and the diffraction signal is essentially free from any signals from product features and the like outside the target itself. The illumination arrangement 2, 120, 130, 170 may be configured to provide illumination of a uniform intensity across a back focal plane of objective 150. Alternatively, by, e.g., including an aperture in the illumination path, illumination may be restricted to on axis or off axis directions.

Figure 6:
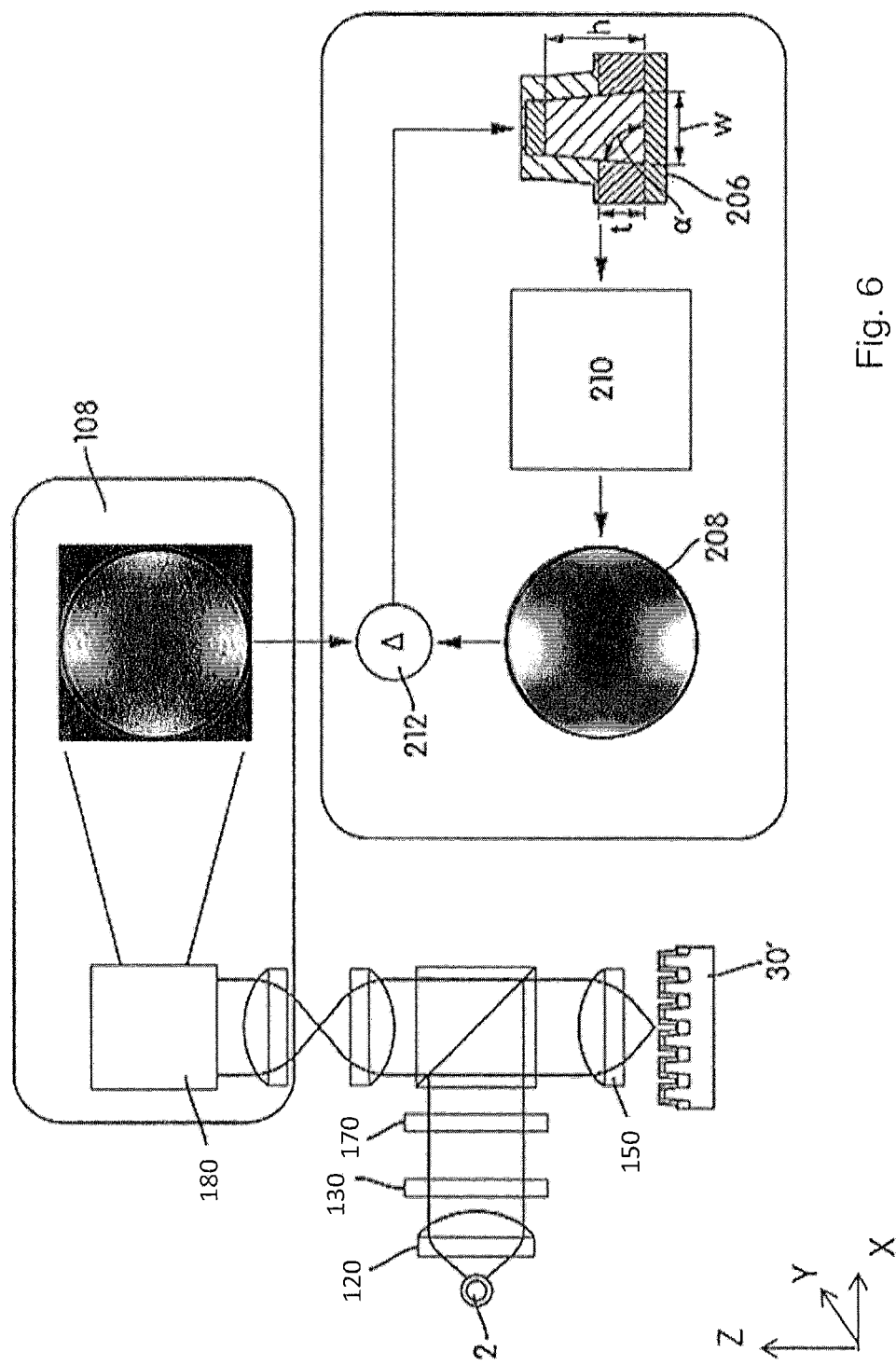
FIG. 6 schematically depicts a process of deriving a plurality of variables of interest based on measurement data.

FIG. 6 schematically depicts an example process of the determination of the value of one or more variables of interest of a target pattern 30' based on measurement data obtained using metrology. Radiation detected by the detector 180 provides a measured radiation distribution 108 for target 30'.

For a given target 30', a radiation distribution 208 can be computed/simulated from a parameterized model 206 using, for example, a numerical Maxwell solver 210. The parameterized model 206 shows example layers of various materials making up, and associated with, the target. The parameterized model 206 may include one or more of variables for the features and layers of the portion of the target under consideration, which may be varied and derived. As shown in FIG. 6, the one or more of the variables may include the thickness t of one or more layers, a width w (e.g., CD) of one or more features, a height h of one or more features, and/or a sidewall angle α of one or more features. Although not shown, the one or more of the variables may further include, but is not limited to, the refractive index (e.g., a real or complex refractive index, refractive index tensor, etc.) of one or more of the layers, the extinction coefficient of one or more layers, the absorption of one or more layers, resist loss during development, a footing of one or more features, and/or line edge roughness of one or more features. The initial values of the variables may be those expected for the target being measured. The measured radiation distribution 108 is then compared at 212 to the computed radiation distribution 208 to determine the difference between the two. If there is a difference, the values of one or more of the variables of the parameterized model 206 may be varied, a new computed radiation distribution 208 calculated and compared against the measured radiation distribution 108 until there is sufficient match between the measured radiation distribution 108 and the computed radiation distribution 208. At that point, the values of the variables of the parameterized model 206 provide a good or best match of the geometry of the actual target 30'. In an embodiment, there is sufficient match when a difference between the measured radiation distribution 108 and the computed radiation distribution 208 is within a tolerance threshold.

A further inspection apparatus suitable for use in embodiments is shown in FIG. 7A. A target T and diffracted rays of measurement radiation used to illuminate the target are illustrated in more detail in FIG. 7B. The inspection apparatus illustrated is of a type known as a dark field metrology apparatus. The inspection apparatus may be a stand-alone device or incorporated in either the lithographic apparatus LA, e.g., at the measurement station, or the lithographic cell LC. An optical axis, which has several branches throughout the apparatus, is represented by a dotted line O. In this apparatus, radiation emitted by source 11 (e.g., a xenon lamp) is directed onto substrate W via optical element 15 by an optical system comprising lenses 12, 14 and objective lens 16. These lenses are arranged in a double sequence of a 4F arrangement. A different lens arrangement can be used, provided that it, e.g., provides a substrate image onto a detector, and simultaneously allows for access of an intermediate pupil-plane for spatial-frequency filtering. Therefore, the angular range at which the radiation is incident on the substrate can be selected by defining a spatial intensity distribution in a plane that presents the spatial spectrum of the substrate plane, here referred to as a (conjugate) pupil plane. In particular, this can be done by inserting an aperture plate 13 of suitable form between lenses 12 and 14, in a plane which is a back-projected image of the objective lens pupil plane. In the example illustrated, aperture plate 13 has different forms, labeled 13N and 13S, allowing different illumination modes to be selected. The illumination system in the present examples forms an off-axis illumination mode. In the first illumination mode, aperture plate 13N provides off-axis radiation from a direction designated, for the sake of description only, as 'north'. In a second illumination mode, aperture plate 13S is used to provide similar illumination, but from an opposite direction, labeled 'south'. Othdr modes of illumination are possible by using different apertures. The rest of the pupil plane is desirably dark as any unnecessary radiation outside the desired illumination mode will interfere with the desired measurement signals.

As shown in FIG. 7B, target T is placed with substrate W normal to the optical axis O of objective lens 16. The substrate W may be supported by a support (not shown). A ray of measurement radiation I impinging on target T from an angle off the axis O gives rise to a zeroth order ray (solid line 0) and two first order rays (dot-chain line +1 and double dot-chain line −1). It should be remembered that with an overfilled small target, these rays are just one of many parallel rays covering the area of the substrate including metrology target T and other features. Since the aperture in plate 13 has a finite width (necessary to admit a useful quantity of radiation), the incident rays I will in fact occupy a range of angles, and the diffracted rays 0 and +1/−1 will be spread out somewhat. According to the point spread function of a small target, each order +1 and −1 will be further spread over a range of angles, not a single ideal ray as shown. Note that the periodic structure pitches of the targets and the illumination angles can be designed or adjusted so that the first order rays entering the objective lens are closely aligned with the central optical axis. The rays illustrated in FIGS. 7A and 7B are shown somewhat off axis, purely to enable them to be more easily distinguished in the diagram.

At least the 0 and +1$^{st}$ orders diffracted by the target T on substrate W are collected by objective lens 16 and directed back through optical element 15. Returning to FIG. 7A, both the first and second illumination modes are illustrated, by designating diametrically opposite apertures labeled as north (N) and south (S). When the incident ray I of measurement radiation is from the north side of the optical axis, that is when the first illumination mode is applied using aperture plate 13N, the +1 diffracted rays, which are labeled +1(N), enter the objective lens 16. In contrast, when the second illumination mode is applied using aperture plate 13S the −1 diffracted rays (labeled −1(S)) are the ones which enter the lens 16.

A beam splitter 17 divides the diffracted beams into two measurement branches. In a first measurement branch, optical system 18 forms a diffraction spectrum (pupil plane image) of the target on first sensor 19 (e.g. a CCD or CMOS sensor) using the zeroth and first order diffractive beams. Each diffraction order hits a different point on the sensor, so that image processing can compare and contrast orders. The pupil plane image captured by sensor 19 can be used for focusing the inspection apparatus and/or normalizing intensity measurements of the first order beam. The pupil plane image can also be used for many measurement purposes such as reconstruction.

In the second measurement branch, optical system 20, 22 forms an image of the target T on sensor 23 (e.g. a CCD or CMOS sensor). In the second measurement branch, an aperture stop 21 is provided in a plane that is conjugate to the pupil-plane. Aperture stop 21 functions to block the zeroth order diffracted beam so that the image of the target formed on sensor 23 is formed only from the −1 or +1 first order beam. The images captured by sensors 19 and 23 are output to processor PU which processes the image, the function of which will depend on the particular type of measurements being performed. Note that the term 'image' is used here in a broad sense. An image of the periodic structure features as such will not be formed, if only one of the −1$^{st}$ and +1$^{st}$ orders is present.

The particular forms of aperture plate 13 and field stop 21 shown in FIGS. 7A, 7C and 7D are purely examples. In an embodiment, on-axis illumination of the targets is used and an aperture stop with an off-axis aperture is used to pass substantially only one first order of diffracted radiation to the sensor. In yet other embodiments, 2nd, 3rd and higher order beams (not shown in FIG. 7A, 7B, 7C or 7D) can be used in measurements, instead of or in addition to the first order beams.

In order to make the measurement radiation adaptable to these different types of measurement, the aperture plate 13 may comprise a number of aperture patterns formed around a disc, which rotates to bring a desired pattern into place. Note that aperture plate 13N or 13S can only be used to measure periodic structures oriented in one direction (X or Y depending on the set-up). For measurement of an orthogonal periodic structure, rotation of the target through 90° and 270° might be implemented. Different aperture plates are shown in FIGS. 7C and 7D. The use of these, and numerous other variations and applications of the apparatus are described in the patent application publications mentioned above.

FIG. 8 depicts a (composite) target formed on a substrate according to known practice. The target in this example comprises four periodic structures (e.g., gratings) 32 to 35 positioned closely together so that they will all be within a measurement spot 31 formed by the metrology radiation illumination beam of the inspection apparatus. The four periodic structures thus are all simultaneously illuminated and simultaneously imaged on sensors 19 and 23. In an example dedicated to measurement of overlay, periodic structures 32 to 35 are themselves composite periodic structures formed by overlying periodic structures that are patterned in different layers of, e.g., the semiconductor device formed on substrate W. Periodic structures 32 to 35 may have differently biased overlay offsets in order to facilitate measurement of overlay between the layers in which the different parts of the composite periodic structures are formed. The meaning of overlay bias will be explained below with reference to FIG. 8. Periodic structures 32 to 35 may also differ in their orientation, as shown, so as to diffract incoming radiation in X and Y directions. In one example, periodic structures 32 and 34 are X-direction periodic structures with bias offsets of +d, −d, respectively. Periodic structures 33 and 35 are Y-direction periodic structures with bias offsets +d, −d respectively. Separate images of these periodic structures can be identified in the image captured by sensor 23. This is only one example of a target. A target may comprise more or fewer than 4 periodic structures, or only a single periodic structure.

FIG. 9 shows an example of an image that may be formed on and detected by the sensor 23, using the target of FIG. 8 in the apparatus of FIG. 7, using the aperture plates 13NW or 13SE from FIG. 7D. While the pupil plane image sensor 19 cannot resolve the different individual periodic structures 32 to 35, the image sensor 23 can do so. The dark rectangle represents the field of the image on the sensor, within which the illuminated spot 31 on the substrate is imaged into a corresponding circular area 41. Within this, rectangular areas 42-45 represent the images of the small target periodic structures 32 to 35. If the targets are located in product areas, product features may also be visible in the periphery of this image field. Image processor and control system PU processes these images using pattern recognition to identify the separate images 42 to 45 of periodic structures 32 to 35. In this way, the images do not have to be aligned very precisely at a specific location within the sensor frame, which greatly improves throughput of the measuring apparatus as a whole.

Once the separate images of the periodic structures have been identified, the intensities of those individual images can be measured, e.g., by averaging or summing selected pixel intensity values within the identified areas. Intensities and/or other properties of the images can be compared with one another. These results can be combined to measure different parameters of the patterning process. Overlay performance is an important example of such a parameter.

Figure 10:
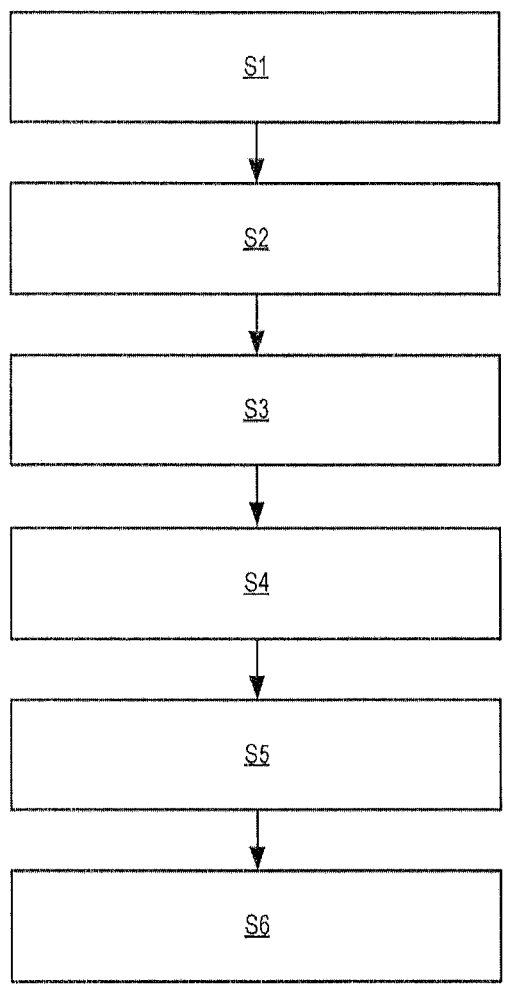
FIG. 10 is a flowchart showing steps of an overlay measurement method using the inspection apparatus of FIG. 3.

FIG. 10 illustrates how, using for example the method described in PCT patent application publication no. WO 2011/012624 (incorporated herein in its entirety by reference), overlay error (i.e., undesired and unintentional overlay misalignment) between the two layers containing the component periodic structures 32 to 35 is measured. This measurement is done through identifying target asymmetry, as revealed by comparing the intensities in the normal and complementary diffraction order images of the target periodic structures to obtain a measure of the intensity asymmetry. In an embodiment, the normal diffraction order is +1$^{st}$ order radiation and the complementary diffraction order is −1$^{st}$ order radiation. While the discussion herein focuses the normal diffraction order as being +1$^{st}$ order radiation and the complementary diffraction order being −1$^{st}$ order radiation, the intensities of other corresponding higher orders can be compared, e.g. +2$^{nd}$ and −2$^{nd}$ orders.

At step S1, the substrate, for example a semiconductor wafer, is processed through a lithographic apparatus, such as the lithographic cell of FIG. 2, one or more times, to create a target including the periodic structures 32-35. At S2, using the inspection apparatus of FIG. 7, an image of the periodic structures 32 to 35 is obtained using only one of the first order diffracted beams (say +1 order). At step S3, whether by changing the illumination mode, or changing the imaging mode, or by rotating substrate W by 180° in the field of view of the inspection apparatus, a second image of the periodic structures using the other first order diffracted beam (−1 order) can be obtained. Consequently the −1 order diffracted radiation is captured in the second image.

Note that, by including only half of the first order diffracted radiation in each image, the 'images' referred to here are not conventional dark field microscopy images. The individual target features of the target periodic structures will not be resolved. Each target periodic structure will be represented simply by an area of a certain intensity level. In step S4, a region of interest (ROI) is identified within the image of each component target periodic structure, from which intensity levels will be measured.

Having identified the ROI for each individual target periodic structure and measured its intensity, the asymmetry of the target, and hence overlay error, can then be determined. This is done (e.g., by the processor PU) in step S5 comparing the intensity values obtained for the normal and complementary diffraction order radiation for each target periodic structure 32-35 to identify their intensity asymmetry, e.g., any difference in their intensity. The term "difference" is not intended to refer only to subtraction. Differences may be calculated in ratio form. In step S6 the measured intensity asymmetries for a number of target periodic structures are used, together with knowledge of any known imposed overlay biases of those target periodic structures, to calculate one or more performance parameters of the patterning process in the vicinity of the target T.

FIGS. 11A-11D show schematic cross sections of target periodic structures (overlay periodic structures), with different bias offsets. These can be used as the target T on substrate W, as seen in FIGS. 7-9. Periodic structures with periodicity in the X direction are shown for the sake of example only. Different combinations of these periodic structures with different biases and with different orientations can be provided separately or as part of a target.

Figure 11A:
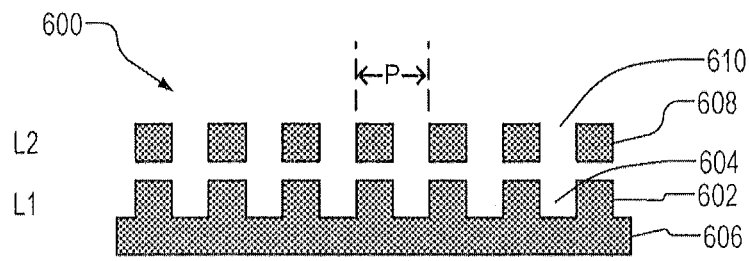
FIG. 11A, FIG. 11B and FIG. 11C respectively show schematic cross-sections of overlay periodic structures having different overlay values in the region of zero.

Starting with FIG. 11A, a target 600 formed in at least two layers, labeled L1 and L2, is shown. In the lower or bottom layer L1, a first periodic structure (the lower or bottom periodic structure), for example a grating, is formed by features 602 and spaces 604 on a substrate 606. In layer L2, a second periodic structure, for example a grating, is formed by features 608 and spaces 610. (The cross-section is drawn such that the features 602, 608 (e.g., lines) extend into the page.) The periodic structure pattern repeats with a pitch P in both layers. Features 602 and 608 may take the form of lines, dots, blocks and via holes. In the situation shown at FIG. 11A, there is no overlay contribution due to misalignment, e.g., no overlay error and no imposed bias, so that each feature 608 of the second structure lies exactly over a feature 602 in the first structure.

Figure 11B:
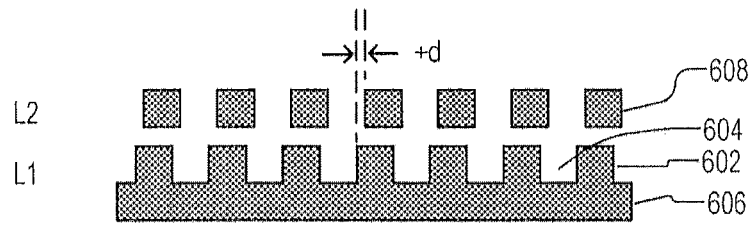

At FIG. 11B, the same target with a first known imposed bias+d is shown, such that the features 608 of the first structure are shifted by a distance d to the right, relative to the features of the second structure. The bias distance d might be a few nanometers in practice, for example 10 nm-20 nm, while the pitch P is for example in the range 300-1000 nm, for example 500 nm or 600 nm. At FIG. 11C, another feature with a second known imposed bias −d, such that the features of 608 are shifted to the left, is depicted. The value of d need not be the same for each structure. Biased periodic structures of this type shown at FIGS. 11A to 11C are described in the prior patent application publications mentioned above.

Figure 11C:
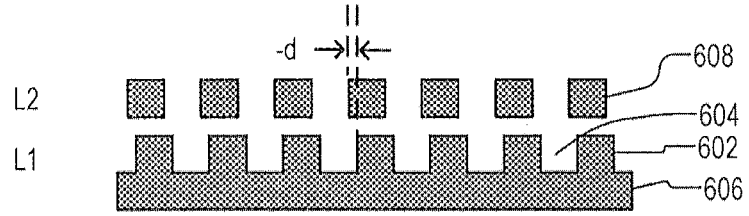
Figure 11D:
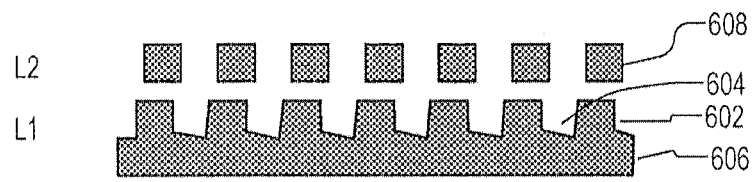
FIG. 11D is a schematic cross-section of an overlay periodic structure having structural asymmetry in a bottom periodic structure due to processing effects.
Figure 11E:
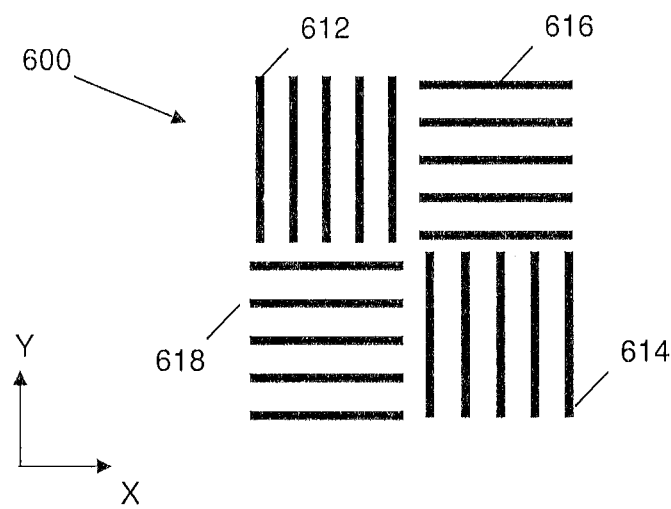
FIG. 11E is a schematic top view of an overlay target having periodic structures with intentional bias.

FIG. 11E schematically depicts, from the top, an example target 600 having sub-targets 612, 614, 616 and 618 comprising periodic structures in upper and lower layers such as depicted in FIGS. 11A-C. The lower layer is not shown in FIG. 11E. In an embodiment, the sub-targets 612, 614, 616 and 618 are designed to measure overlay in two perpendicular directions (e.g., X and Y) and have an imposed bias d to facilitate that (as described above in respect of FIGS. 11B and 11C). While the embodiment of FIG. 11E shows four sub-targets, there can be a different number and they can all be used to measure overlay in 1 direction or to measurement overlay in more than 2 directions.

In an embodiment, sub-targets 612 and 614 are designed to together measure overlay in the X-direction. In an embodiment, sub-target 612 has a bias of +d, while sub-target 614 has a bias of −d. In an embodiment, sub-targets 616 and 618 are designed to together measure overlay in the Y-direction. In an embodiment, sub-target 616 has a bias of +d, while sub-target 618 has a bias of −d.

Figure 11F:
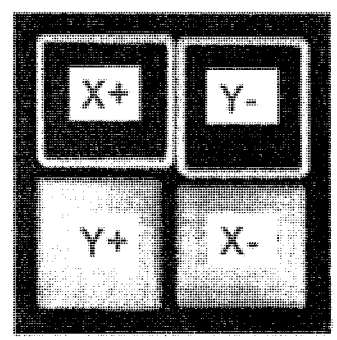
FIG. 11F depicts an example of a detected diffraction signal of a particular order radiation from a target such as depicted in FIG. 11E.
Figure 11G:
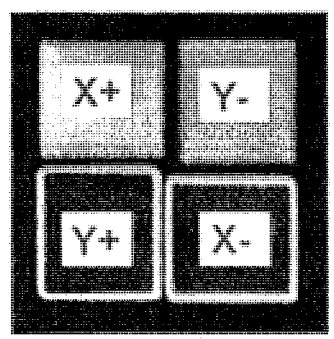
FIG. 11G depicts an example of a detected diffraction signal of another particular order radiation from a target such as depicted in FIG. 11E.

FIG. 11F depicts an example of a detected diffraction signal of the normal (e.g., $+1^{st}$) order radiation from step S2 of a target 600 such as depicted in FIG. 11E. FIG. 11G depicts an example of a detected diffraction signal of the complementary (e.g., $-1^{st}$) order radiation from step S3 of a target 600 such as depicted in FIG. 11E. For each periodic structure direction (X and Y) there are two periodic structures with opposite directions of intentional bias shown in FIGS. 11F and 11G by "+" (for +d bias) and "−" (for −d bias). So, X+ represents a detected diffraction signal from sub-target 612, X− represents a detected diffraction signal from sub-target 614, Y+ represents a detected diffraction signal from sub-target 618 and Y− represents a detected diffraction signal from sub-target 616. Thus, four diffraction intensity signals are detected per each periodic structure periodicity direction.

Figure 11H:
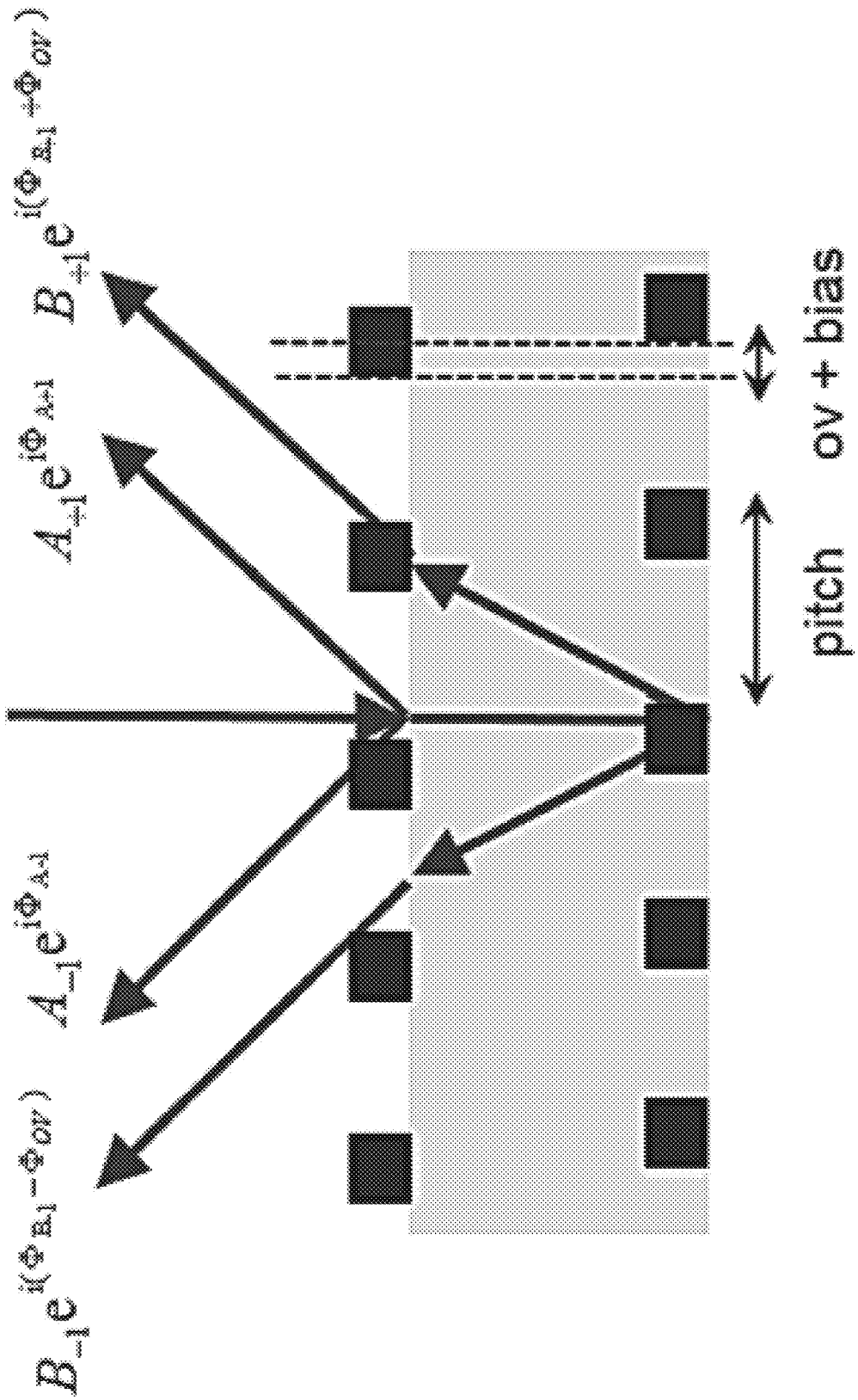
FIG. 11H is schematic depiction of a simple model for describing diffraction of radiation from a target with a two-layer periodic structure.

FIG. 11H is schematic depiction of a simple model for describing diffraction of radiation from a target (such as a sub-target 612, 614, 616 or 618) with a two-layer periodic structure (such as shown in FIGS. 11A-11C). The complex amplitude of diffracted radiation from the upper layer and lower layer are shown. Diffracted radiation from the lower layer includes a phase contribution from overlay.

Figure 12:
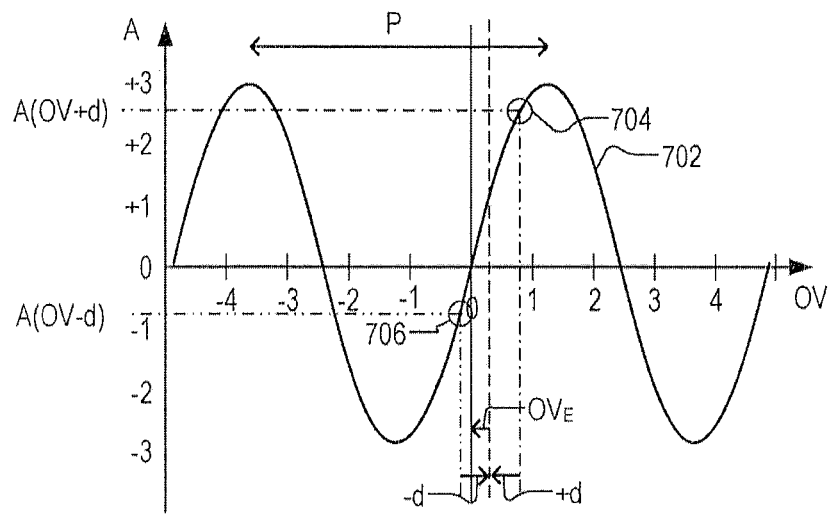
FIG. 12 illustrates principles of overlay measurement in an ideal target, not subject to structural asymmetry.
Figure 13:
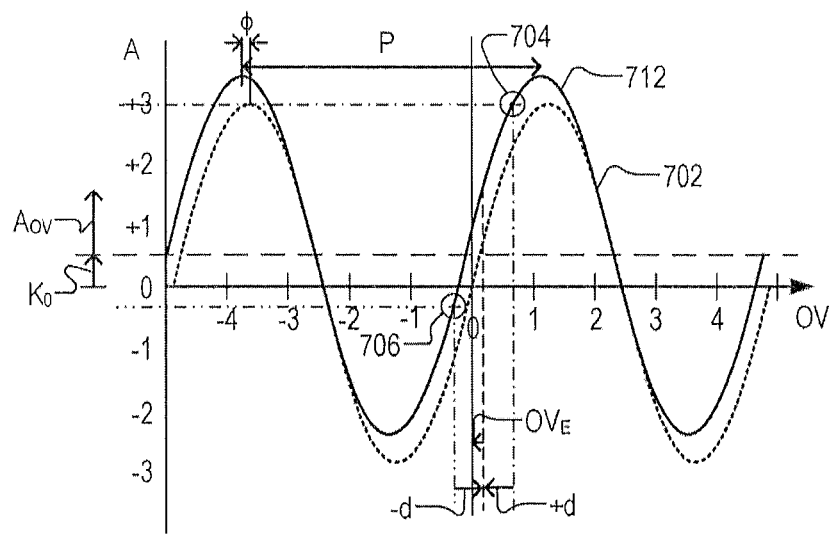
FIG. 13 illustrates principles of overlay measurement in a non-ideal target, with correction of structural asymmetry as disclosed in embodiments herein.

In FIG. 12 a curve 702 illustrates the relationship between overlay OV and intensity asymmetry A for an 'ideal' target having zero offset and no structural asymmetry within the individual periodic structures forming the target, and in particular within the individual periodic structure of the first structure. Consequently, the target asymmetry of this ideal target comprises only an overlay contribution due to misalignment of the first structure and second structure resultant from a known imposed bias and overlay error $OV_E$. This graph, and the graph of FIG. 13, illustrate the principles behind the disclosure only, and in each graph, the units of intensity asymmetry A and overlay OV are arbitrary. Examples of actual dimensions will be given further below.

In the 'ideal' situation of FIG. 12, the curve 702 indicates that the intensity asymmetry A has a non-linear periodic relationship (e.g., sinusoidal relationship) with the overlay. The period P of the sinusoidal variation corresponds to the period or pitch P of the periodic structures, converted of course to an appropriate scale. The sinusoidal form is pure in this example, but can include harmonics in real circumstances.

As mentioned above, biased periodic structures (having a known imposed overlay bias) can be used to measure overlay, rather than relying on a single measurement. This bias has a known value defined in the patterning device (e.g. a reticle) from which it was made, that serves as an on-substrate calibration of the overlay corresponding to the measured intensity asymmetry. In the drawing, the calculation is illustrated graphically. In steps S1-S5, intensity asymmetry measurements $A_{+d}$ and $A_{-d}$ are obtained for periodic structures having imposed biases +d and −d respectively (as shown in FIG. 11B and FIG. 11C, for example). Fitting these measurements to the sinusoidal curve gives points 704 and 706 as shown. Knowing the biases, the true overlay error $OV_E$ can be calculated. The pitch P of the sinusoidal curve is known from the design of the target. The vertical scale of the curve 702 is not known to start with, but is an unknown factor which can be referred to as a 1st harmonic proportionality constant, K. Thus, overlay sensitivity K is a measure of the sensitivity of the intensity asymmetry measurements to overlay. In an embodiment, it is a proportionality of the measured intensity with respect to overlay. It thus helps detect process dependency of overlay.

In equation terms, the relationship between overlay error $OV_E$ and intensity asymmetry A is assumed to be:

$$A_{\pm d} = K \sin(OV_E \pm d) \qquad (1)$$

where overlay error $OV_E$ is expressed on a scale such that the target pitch P corresponds to an angle $2\pi$ radians. Using two measurements of periodic structures with different, known biases (e.g. +d and −d), the overlay error $OV_E$ can be calculated using:

$$OV_E = \operatorname{atan}\left(\frac{A_{+d} + A_{-d}}{A_{+d} - A_{-d}} \cdot \tan(d)\right) \qquad (2)$$

Referring back to FIG. 11H, the overlay OV (also referred to overlay error $OV_E$) can also be evaluated as follows. Specifically, based on the model represented in FIG. 11H, the intensities of the $+1^{st}$ and $-1^{st}$ order of diffracted radiation can be calculated as follows:

$$\begin{aligned} I_{+1} &= \left|A_{+1}e^{i\Phi_{A_{+1}}} + B_{+1}e^{i(\Phi_{B_{+1}}+\Phi_{OV})}\right|^2 = \\ &\quad A_{+1}^2 + B_{+1}^2 + 2A_{+1}B_{+1}\times\cos[\Phi_{A_{+1}} - \Phi_{B_{+1}} - \Phi_{OV}] \end{aligned} \qquad (3)$$

$$\begin{aligned} I_{-1} &= \left|A_{-1}e^{i\Phi_{A_{-1}}} + B_{-1}e^{i(\Phi_{B_{-1}}-\Phi_{OV})}\right|^2 = \\ &\quad A_{-1}^2 + B_{-1}^2 + 2A_{-1}B_{-1}\times\cos[\Phi_{A_{-1}} - \Phi_{B_{-1}} + \Phi_{OV}] \end{aligned}$$

where $$\Phi_{OV} = \frac{2\pi}{P}(OV \pm d)$$

is the phase difference due to overlay and bias and $$\Phi_A - \Phi_B = \beta \propto 4\pi \frac{T}{\lambda}$$

is the rest of the phase difference between diffracted radiation from upper and lower layers, which is proportional to the thickness T of the layer between the upper and lower periodic structures and inversely proportional to the wavelength of the incident radiation.

For convenience, the four intensities of one periodic structure direction (e.g. X) can be designated as follows:
PBN (+1st diffraction order from positive bias periodic structure)
PBC (−1st diffraction order from positive bias periodic structure)
NBN (+1st diffraction order from negative bias periodic structure)
NBC (−1st diffraction order from negative bias periodic structure)

So, $\Delta I_{PB}$ can be designated as PBN-PBC and $\Delta I_{NB}$ can be designated as NBN-NBC. Then, with the assumption that the amplitude and phase (excluding overlay phase) of diffracted waves from the +1st and −1st order radiation and also from positive bias and negative bias periodic structures are equal, and the optics of the metrology device is symmetric itself, a difference between intensity of +1st and −1st order radiation is derived as $\Delta I = K \cdot \sin(\Phi_{OV})$, with K being overlay proportionality equal to $K = 4 A \cdot B \cdot \sin(\beta)$. Hence, the overlay can be calculated as follows:

$$OV = \frac{P}{2\pi} \tan^{-1}\left( \tan\left(\frac{2\pi d}{P}\right) \cdot \frac{\Delta I_{PB} + \Delta I_{NB}}{\Delta I_{PB} - \Delta I_{NB}} \right) \quad (4)$$

Now, FIG. 11D shows schematically a phenomenon of structural asymmetry, in this case structural asymmetry in the first structure (lower or bottom structure asymmetry). The features in the periodic structures at FIGS. 11A to 11C, are shown as perfectly square-sided, when a real feature would have some slope on the side, and a certain roughness. Nevertheless they are intended to be at least symmetrical in profile. The features 602 and/or spaces 604 at FIG. 11D in the first structure no longer have a symmetrical form at all, but rather have become distorted by one or more processing steps. Thus, for example, a bottom surface of each space has become tilted (bottom wall tilt). For example, side wall angles of the features and spaces have become asymmetrical. As a result of this, the overall target asymmetry of a target will comprise an overlay contribution independent of structural asymmetry (i.e., an overlay contribution due to misalignment of the first structure and second structure; itself comprised of overlay error and any known imposed bias) and a structural contribution due to this structural asymmetry in the target.

When overlay is measured by the method of FIG. 10 using only two biased periodic structures, the process-induced structural asymmetry cannot be distinguished from the overlay contribution due to misalignment, and overlay measurements (in particular to measure the undesired overlay error) become unreliable as a result. Structural asymmetry in the first structure (bottom periodic structure) of a target is a common form of structural asymmetry. It may originate, for example, in the substrate processing steps such as chemical-mechanical polishing (CMP), performed after the first structure was originally formed.

FIG. 13 shows a first effect of introducing structural asymmetry, for example the bottom periodic structure asymmetry illustrated in FIG. 11D. The 'ideal' sinusoidal curve 702 no longer applies. However, at least approximately, bottom periodic structure asymmetry or other structural asymmetry has the effect of adding an intensity shift term $K_0$ and a phase shift term (to the intensity asymmetry $A_{\pm d}$. The resulting curve is shown as 712 in the diagram, with label $K_0$ indicating the intensity shift term, and label φ indicating the phase offset term. The intensity shift term $K_0$ and phase shift term φ are dependent upon a combination of the target and a selected characteristic of the measurement radiation, such as the wavelength and/or polarization of the measurement radiation, and is sensitive to process variations. In equation terms, the relationship used for calculation in step S6 becomes:

$$A_{\pm d} = K_0 + K \sin(OV_E \pm d + \phi) \quad (5)$$

Where there is structural asymmetry, the overlay model described by equation (2) will provide overlay error values which are impacted by the intensity shift term $K_0$ and phase shift term 4, and will be inaccurate as a consequence. The structural asymmetry will also result in differences in measurements of the same target using one or more different measurement parameters (e.g., wavelength of the measurement beam, polarization of the measurement beam, etc.), when mapping the overlay error, because intensity and phase shift are, e.g., wavelength and/or polarization dependent.

The overlay calculations of modified step S6 rely on certain assumptions. Firstly, it is assumed intensity asymmetry behaves as a sine function of the overlay, with the period P corresponding to the grating pitch. These assumptions are valid for present overlay ranges. The number of harmonics can be designed to be small, because the small pitch-wavelength ratio only allows for a small number of propagating diffraction orders from the grating. However, in practice the overlay contribution to the intensity asymmetry due to misalignment may not necessarily be truly sinusoidal, and may not necessarily be completely symmetrical about OV=0.

So, the effect of structural asymmetry can be generally formulated as:

$$\Delta I_+ = K(OV+d) + \Delta I_{BG} \quad (6)$$

$$\Delta I_- = K(OV-d) + \Delta I_{BG} \quad (7)$$

where $\Delta I_-$ (also synonymous with A−) and $\Delta I_+$ (also synonymous with $A_+$) represent the intensity asymmetry measured and $\Delta I_{BG}$ is the contribution to the intensity asymmetry of the structural asymmetry. And so, the overlay error $\Delta OV$ can be considered as a function of $\Delta I_{BG}/K$.

Now, it has been further discovered that, in addition to or alternatively to structural asymmetry in a target, a stack difference between adjacent periodic structures of a target or between adjacent targets may be a factor that adversely affects the accuracy of measurement, such as overlay measurement. Stack difference may be understood as an undesigned difference in physical configurations between adjacent periodic structures or targets. Stack difference causes a difference in an optical property (e.g., intensity, polarization, etc.) of measurement radiation between the adjacent periodic structures or targets that is due to other than overlay error, other than intentional bias and other than structural asymmetry common to the adjacent periodic structures or targets. Stack difference includes, but is not limited to, a thickness difference between the adjacent periodic structures or targets (e.g., a difference in thickness of one or more layers such that one periodic structure or target is higher or lower than another periodic structure or target designed to be at a substantially equal level), a refractive index difference between the adjacent periodic structures or targets (e.g., a difference in refractive index of one or more layers such that the combined refractive index for the one or more layers for one periodic structure or target is different than the combined refractive index for the one or more layers for of another periodic structure or target even though designed to have a substantially equal combined refractive index), a difference in material between the adjacent periodic structures or targets (e.g., a difference in the material type, material uniformity, etc. of one or more layers such that there is a difference in material for one periodic structure or target from another periodic structure or target designed to have a substantially same material), a difference in the grating period of the structures of adjacent periodic structures or targets (e.g., a difference in the grating period for one periodic structure or target from another periodic structure or target designed to have a substantially same grating period), a difference in depth of the structures of adjacent periodic structures or targets (e.g., a difference due to etching in the depth of structures of one periodic structure or target from another periodic structure or target designed to have a substantially same depth), a difference in width (CD) of the features of adjacent periodic structures or targets (e.g., a difference in the width of features of one periodic structure or target from another periodic structure or target designed to have a substantially same width of features), etc. In some examples, the stack difference is introduced by processing steps, such as CMP, layer deposition, etching, etc. in the patterning process. In an embodiment, periodic structures or targets are adjacent if within 200 μm of each other, within 150 μm of each other, within 100 μm of each other, within 75 μm of each other, within 50 μm of each other, within 40 μm of each other, within 30 μm of each other, within 20 μm of each other, or within 10 μm of each other.

The effect of stack difference (which can be referred to as grating imbalance between gratings) can be generally formulated as:

$$\Delta I_+ = (K+\Delta K)(OV+d) \quad (8)$$

$$\Delta I_- = (K-K)(OV-d) \quad (9)$$

wherein $\Delta K$ represents a difference in the overlay sensitivity attributable to the stack difference. And so, the overlay error $\Delta OV$ can be proportional to $\Delta K/K$ d.

So, in order to characterize the stack difference, one or more stack difference parameters can be defined. As noted above, a stack difference parameter is a measure of the un-designed different physical configuration of the adjacent periodic structures or targets. In an embodiment, the stack difference parameter can be determined from evaluating cross-sections of the adjacent periodic structures or targets.

In an embodiment, the stack difference parameter can be determined for lower adjacent gratings of a composite grating by evaluating the lower adjacent gratings before the upper gratings are applied. In an embodiment, the stack difference parameter can be derived from a reconstruction of the adjacent periodic structures or targets from optical measurements of the adjacent periodic structures or targets or from cross-sections of the adjacent periodic structures or targets. That is, the physical dimensions, characteristics, materials properties, etc. are reconstructed and the differences between the adjacent periodic structures or targets are determined to arrive at a stack difference parameter.

An embodiment of the stack difference parameter is a periodic structure intensity imbalance (GI) which can be defined as:

$$GI = 2 * \frac{\hat{I}^{+d} - \hat{I}^{-d}}{\hat{I}^{+d} + \hat{I}^{-d}} \quad (8)$$

where $\hat{I}^{+d}$ is the average of the $+1^{st}$ diffraction order intensity signal diffracted by a first periodic structure having a +d bias, $I_{+1}^{+d}$, and $-1^{st}$ diffraction order intensity signal diffracted by the first periodic structure having the +d bias, $I_{-1}^{+d}$. Similarly, $\hat{I}^{-d}$ is the average of the $+1^{st}$ diffraction order intensity signal diffracted by a second periodic structure having a −d bias, $I_{+1}^{-d}$, and $-1^{st}$ diffraction order intensity signal diffracted by the second periodic structure having the −d bias, $I_{-1}^{-d}$. In an embodiment, the periodic structure intensity imbalance (GI) can be a derived version, such as $$\frac{\hat{I}^{+d} - \hat{I}^{-d}}{\hat{I}^{+d} + \hat{I}^{-d}}, \frac{\hat{I}^{+d} + \hat{I}^{-d}}{\hat{I}^{+d} - \hat{I}^{-d}},$$

etc.

An issue with the method of overlay calculation described above is that assumptions that were made for its derivation often may not hold. For example, optical path properties and/or the source of radiation may not be completely symmetric between the normal and the complementary radiation; this can be mixed with actual diffraction intensities. Additionally or alternatively, the metrology target is not structurally symmetric. As noted above, this happens typically due to processing steps in the patterning process. The asymmetric behavior can occur between normal and complementary intensities, for instance, due to structural asymmetry of a lower periodic structure of the target (BGA) and/or due to a stack difference between positive bias and negative bias periodic structures (which can be characterized by a periodic structure intensity imbalance (GI)).

To help resolve one or more of the errors arising out of such asymmetries, calibrations can be used to, e.g., to handle, to some extent, asymmetry in optical path properties and/or the source of radiation. And, as for physical differences in the target (e.g., lower periodic structure structural asymmetry (BGA) and/or stack difference), one or more metrics (such as periodic structure intensity imbalance (GI) for stack difference) can be used to identify, e.g., a wavelength in which there is a lower chance of issue. For example, a "best" wavelength can be chosen based of indirect metrics that attempt to predict the good regions of wavelength spectrum. Such identification of a "best" wavelength is a challenging task though considering that sometimes the metrics do not agree. Moreover, the accuracy of overlay may not always be believed to be optimal even at the "best" selected wavelength.

Thus, it is desirable to be able to address and/or correct for these errors using a new overlay determination technique. Such an overlay determination technique can be used in various applications. A first example application is to derive a desired overlay value in high volume or during production, e.g., to derive overlay values as part of the execution of a patterning process for use in, e.g., control, design, etc. of the patterning process. Another example application is to derive an overlay value for use in design, control, etc. of a metrology process, e.g., to select a condition of the metrology process such as radiation wavelength used for measurement (and which metrology process can use a different overlay calculation technique such as the techniques described above with respect to equations (1)-(4)).

In an embodiment of the new overlay determination technique, a mathematical model is used that considers several asymmetries in the radiation besides that caused by an overlay error and is designed to measure accurate overlay, e.g., being robust to target asymmetry and/or sensor asymmetry. In an embodiment, the model involves equations that are based on a plurality of different wavelengths. In an embodiment, a system of 16 equations is provided with 4 different wavelengths as variables thereof. Thus, in this embodiment, to derive an overlay value, measurements are obtained for 4 different wavelengths and the system of 16 equations is solved, wherein the equations have, e.g., 16 unknowns.

An example of the set of equations is presented below that are based on 4 different wavelengths and for a target such as depicted in FIG. 11E. In particular, it is for a particular overlay direction (e.g., X or Y direction) and the sub-targets associated with that overlay direction. For example, it can be for the combination of sub-targets 612 and 614 for measuring overlay in the X-direction, wherein sub-target 612 has a bias of +d, while sub-target 614 has a bias of −d. Or, it can be for the combination of sub-targets 616 and 618 for measuring overlay in the Y-direction, wherein sub-target 616 has a bias of +d, while sub-target 618 has a bias of –d). The system of equations comprises:

$$F_1 = A^2 + B_1^2 + 2 \cdot A \cdot B_1 \cdot \cos\left(\beta_1 - \frac{2\pi}{P}\cdot(OV + d)\right) - \frac{I_{PBN}^{\lambda_1}}{\alpha_1 \cdot \gamma_1} \quad (9)$$

$$F_2 = A^2 + B_1^2 + 2 \cdot A \cdot B_1 \cdot \cos\left(\beta_1 \cdot \frac{\lambda_1}{\lambda_2} - \frac{2\pi}{P}\cdot(OV + d)\right) - \frac{I_{PBN}^{\lambda_2}}{\alpha_1 \cdot \gamma_2} \quad (10)$$

$$F_3 = A^2 + B_1^2 + 2 \cdot A \cdot B_1 \cdot \cos\left(\beta_1 \cdot \frac{\lambda_1}{\lambda_3} - \frac{2\pi}{P}\cdot(OV + d)\right) - \frac{I_{PBN}^{\lambda_3}}{\alpha_1 \cdot \gamma_3} \quad (11)$$

$$F_4 = A^2 + B_1^2 + 2 \cdot A \cdot B_1 \cdot \cos\left(\beta_1 \cdot \frac{\lambda_1}{\lambda_4} - \frac{2\pi}{P}\cdot(OV + d)\right) - \frac{I_{PBN}^{\lambda_4}}{\alpha_1 \cdot \gamma_4} \quad (12)$$

$$F_5 = A^2 + B_2^2 + 2 \cdot A \cdot B_2 \cdot \cos\left(\beta_2 + \frac{2\pi}{P}\cdot(OV + d)\right) - \frac{I_{PBC}^{\lambda_1}}{\alpha_2 \cdot \gamma_1} \quad (13)$$

$$F_6 = A^2 + B_2^2 + 2 \cdot A \cdot B_2 \cdot \cos\left(\beta_2 \cdot \frac{\lambda_1}{\lambda_2} + \frac{2\pi}{P}\cdot(OV + d)\right) - \frac{I_{PBC}^{\lambda_2}}{\alpha_2 \cdot \gamma_2} \quad (14)$$

$$F_7 = A^2 + B_2^2 + 2 \cdot A \cdot B_2 \cdot \cos\left(\beta_2 \cdot \frac{\lambda_1}{\lambda_3} + \frac{2\pi}{P}\cdot(OV + d)\right) - \frac{I_{PBC}^{\lambda_3}}{\alpha_2 \cdot \gamma_3} \quad (15)$$

$$F_8 = A^2 + B_2^2 + 2 \cdot A \cdot B_2 \cdot \cos\left(\beta_2 \cdot \frac{\lambda_1}{\lambda_4} + \frac{2\pi}{P}\cdot(OV + d)\right) - \frac{I_{PBC}^{\lambda_4}}{\alpha_2 \cdot \gamma_4} \quad (16)$$

$$F_9 = A^2 + B_3^2 + 2 \cdot A \cdot B_3 \cdot \cos\left(\beta_3 - \frac{2\pi}{P}\cdot(OV - d)\right) - \frac{I_{NBN}^{\lambda_1}}{\alpha_1 \cdot \gamma_1} \quad (17)$$

$$F_{10} = A^2 + B_3^2 + 2 \cdot A \cdot B_3 \cdot \cos\left(\beta_3 \cdot \frac{\lambda_1}{\lambda_2} - \frac{2\pi}{P}\cdot(OV - d)\right) - \frac{I_{NBN}^{\lambda_2}}{\alpha_1 \cdot \gamma_2} \quad (18)$$

$$F_{11} = A^2 + B_3^2 + 2 \cdot A \cdot B_3 \cdot \cos\left(\beta_3 \cdot \frac{\lambda_1}{\lambda_3} - \frac{2\pi}{P}\cdot(OV - d)\right) - \frac{I_{NBN}^{\lambda_3}}{\alpha_1 \cdot \gamma_3} \quad (19)$$

$$F_{12} = A^2 + B_3^2 + 2 \cdot A \cdot B_3 \cdot \cos\left(\beta_3 \cdot \frac{\lambda_1}{\lambda_4} - \frac{2\pi}{P}\cdot(OV - d)\right) - \frac{I_{NBN}^{\lambda_4}}{\alpha_1 \cdot \gamma_4} \quad (20)$$

$$F_{13} = A^2 + B_4^2 + 2 \cdot A \cdot B_4 \cdot \cos\left(\beta_4 + \frac{2\pi}{P}\cdot(OV - d)\right) - \frac{I_{NBC}^{\lambda_1}}{\alpha_2 \cdot \gamma_1} \quad (21)$$

$$F_{14} = A^2 + B_4^2 + 2 \cdot A \cdot B_4 \cdot \cos\left(\beta_4 \cdot \frac{\lambda_1}{\lambda_2} + \frac{2\pi}{P}\cdot(OV - d)\right) - \frac{I_{NBC}^{\lambda_2}}{\alpha_2 \cdot \gamma_2} \quad (22)$$

$$F_{15} = A^2 + B_4^2 + 2 \cdot A \cdot B_4 \cdot \cos\left(\beta_4 \cdot \frac{\lambda_1}{\lambda_3} + \frac{2\pi}{P}\cdot(OV - d)\right) - \frac{I_{NBC}^{\lambda_3}}{\alpha_2 \cdot \gamma_3} \quad (23)$$

$$F_{16} = A^2 + B_4^2 + 2 \cdot A \cdot B_4 \cdot \cos\left(\beta_4 \cdot \frac{\lambda_1}{\lambda_4} + \frac{2\pi}{P}\cdot(OV - d)\right) - \frac{I_{NBC}^{\lambda_4}}{\alpha_2 \cdot \gamma_4} \quad (24)$$

where $F_1, \ldots, F_{16}$ are the functions for optimization (e.g., have their absolute values minimized), OV is the overlay, $\lambda_1 \ldots \lambda_4$ are the different wavelengths of the illumination measurement radiation used to illuminate the target for the measurements, A is amplitude of the diffracted waves from the upper periodic structure of the sub-targets, $B_1 \ldots B_4$ are the amplitudes of the diffracted waves from the lower periodic structures of the sub-target (in this case, there are 4 variables B, one associated with each combination of sub-target and diffraction order and can be different (e.g., independent) from each other (e.g., have different values) in certain ways as described further hereafter), $\beta_1 \ldots \beta_4$ are the phase differences arising between the radiation incident on the lower periodic structure and incident on the upper periodic structures (in this example, there are 4 variables β, one associated with each combination of sub-target and diffraction order and can be different from each other (e.g., have different values) in certain ways as described further hereafter), P is the pitch of the target, d is the bias of the target, $\alpha_1$ and $\alpha_2$ are factors accounting for sensor asymmetry error (in this example, there are 2 variables α, one associated with each diffraction order and can be different from each other (e.g., have different values) in certain ways as described further hereafter), $\gamma_1 \ldots \gamma_4$ are factors accounting for changes of illumination measurement radiation intensities among measurements by different wavelengths (specifically the intensity can change when measuring at different wavelengths since they would typically be done at different times and/or the intensity can change to obtain the different wavelengths and are equal in number with the number of wavelengths), and $I_{PBN}$, $I_{PBC}$, $I_{NBN}$, and $I_{NBC}$ are the extracted mean intensities measured using radiation at the respectively identified wavelengths $\lambda_1 \ldots \lambda_4$ and corresponding respective to +1st diffraction order radiation from a positive bias periodic structure (e.g., sub-target 612)(PBN), –1st diffraction order from the positive bias periodic structure (e.g., sub-target 612) (PBC), +1st diffraction order from negative bias periodic structure (e.g., sub-target 614) (NBN), and –1st diffraction order from negative bias periodic structure (e.g., sub-target 614) (NBC).

While, in this example, 4 different wavelengths are used, a different number of wavelengths could be used. For example, 2 wavelengths could be used provided various assumptions are made. As another example, more than 4 wavelengths could be used. Adding information from more wavelengths than 4 (or more than 2) can be used to increase the robustness of the model to variation. Additionally or alternatively, more wavelengths than 4 can be used to determine extra unknown parameters, such as spot inhomogeneity (specifically, the asymmetry from the sensor that differs between positive bias and negative bias intensities).

In an embodiment, different sources of error can be taken into account in the system of equations. For example, in an embodiment, sensor asymmetry between positive (e.g., +$1^{st}$) order and negative (e.g., –$1^{st}$) order radiation, structural asymmetry of the target, and/or stack difference within the target.

In an embodiment, sensor asymmetry between positive (e.g., +$1^{st}$) order and negative (e.g., –$1^{st}$) order radiation is accounted for by having different variables $\alpha_1$ and $\alpha_2$. In an embodiment, $\alpha_1$ corresponds to the positive (e.g., +$1^{st}$) order radiation and $\alpha_2$ corresponds to the negative (e.g., –$1^{st}$) order radiation. Typically, $\alpha_1$ and $\alpha_2$ will have different values when the equations are evaluated to determine the overlay.

In an embodiment, structural asymmetry of the target is accounted for by having certain different amplitude B variables and certain different β variables. In particular, in an embodiment, an amplitude variable (e.g., $B_1$ and/or $B_3$) of radiation for a positive value of a certain diffraction order (e.g., +$1^{st}$) of the measured radiation is different from an amplitude variable (e.g., $B_2$ and/or $B_4$ respectively for $B_1$ and/or $B_3$) of radiation for a negative value of the certain diffraction order (e.g., –$1^{st}$) of the measured radiation and at least a phase variable (e.g., $\beta_1$ and/or $\beta_3$) of radiation for the positive value of the certain diffraction order of the measured radiation is different from a phase variable (e.g., $\beta_2$ and/or $\beta_4$ respectively for $\beta_1$ and/or $\beta_3$) of radiation for the negative value of the certain diffraction order of the measured radiation. In an embodiment, $B_1$, $B_3$, $\beta_1$ and/or $\beta_3$ corresponds to +1st order radiation and $B_2$, $B_4$, $\beta_2$ and/or $\beta_4$ corresponds to –$1^{st}$ order radiation. Since typically some target asymmetry is present, $B_1$ and $B_2$, $B_3$ and $B_4$, $\beta_1$ and $\beta_2$, and $\beta_3$ and $\beta_4$ will have different values when the equations are evaluated to determine the overlay.

In an embodiment, stack difference within the target is accounted for by having certain different amplitude B variables and certain different β variables. In particular, in an embodiment, an amplitude variable (e.g., $B_1$ and/or $B_2$) of radiation for a sub-target of the target with a positive bias (e.g., +d) is different from an amplitude variable (e.g., $B_3$ and/or $B_4$ respectively for $B_1$ and/or $B_2$) of radiation for a sub-target of the target with a negative bias (e.g., −d) and at least a phase variable (e.g., $\beta_1$ and/or $\beta_2$) of radiation for the sub-target of the target with the positive bias (e.g., +d) is different from a phase variable (e.g., $\beta_3$ and/or $\beta_4$ respectively for $\beta_1$ and/or $\beta_2$) of radiation for a sub-target of the target with a negative bias (e.g., −d). In an embodiment, $B_1$, $B_2$, $\beta_1$ and/or $\beta_2$ corresponds to a sub-target of the target with a positive bias and $B_3$, $B_4$, $\beta_3$ and/or $\beta_4$ corresponds to a sub-target of the target with a negative bias. Since typically there is some stack difference present, $B_1$ and $B_3$, $B_2$ and $B_4$, $\beta_1$ and $\beta_3$, and $\beta_2$ and $\beta_4$ will have different values when the equations are evaluated to determine the overlay.

In an embodiment, the system of equations (9)-(24) may be formed such that variables corresponding to amplitudes (such as A, B) are dependent on one or more illumination conditions, for example wavelength, and that variables corresponding to correction parameters (such as $\alpha_1$ and $\alpha_2$) are not necessarily dependent on one or more illumination conditions, for example wavelength. The system of equations (9)-(24) may comprise an additional offset constant added to each of the right hand terms of equations (9)-(24).

So, to evaluate equations (9)-(24), the mean intensities of the target are extracted as described above in respect of FIG. 10 (e.g. by a pattern recognition method) for four different wavelengths. In particular, in an embodiment, $I_{PBN}$, $I_{PBC}$, $I_{NBN}$, and $I_{NBC}$ are obtained for each of $\lambda_1 \ldots \lambda_4$ yielding 16 intensity values. Further, the pitch P, bias d and wavelength values $\lambda_1 \ldots \lambda_4$ are known in the equations. So, there are 16 unknowns—overlay OV, amplitude A, amplitudes $B_1 \ldots B_4$, phase differences $\beta_1 \ldots \beta_4$, sensor asymmetry error factors $\alpha_1$ and $\alpha_2$, and illumination measurement radiation intensity factors $\gamma_1 \ldots \gamma_4$. Then, the equations (9)-(24) are solved using a technique to solve nonlinear equations to arrive at a value of at least overlay OV.

So, in an embodiment, in order to obtain the parameters of the model (and derive a value of overlay OV), an optimization problem of the equations can be formulated and solved using one or more known nonlinear equation solving techniques. One or more various algorithms can be used to solve the optimization problem, such as the interior-point and the trust-region reflective algorithms. Furthermore, analytical calculation of the gradient of the objective function and supplying the optimization algorithm with that calculated gradient, can significantly increase the speed of convergence and accuracy of the results.

A particular non-limiting example of a technique to solve the equations is now discussed. For a more clear presentation of the final optimization problem, several auxiliary variables are defined, namely:

$$F_i' = \alpha_i \gamma_i \cdot F_i, i \in \{1,2,3,4\}, F_i' = \alpha_2 \gamma_{i-4} \cdot F_i, i \in \{5,6,7,8\}$$

$$F_i' = \alpha_i \gamma_{i-5} \cdot F_i, i \in \{9,10,11,12\}, F_i' = \alpha_2 \gamma_{i-12} \cdot F_i, i \in \{13,14,15,16\}$$

So, the optimization problem can be written as the following objective function:

$$\min_x J(x) = \min_x \left\| \frac{F'(x)}{\sigma} \right\| = \min_x \sum_{i=1}^{16} \left( \frac{F_i'(x)}{\sigma_i} \right)^2$$

subject to: $lb \le x \le ub$ where $$\sigma = \{\sigma_{PBN}^{\lambda_1}, K, \sigma_{PBN}^{\lambda_4}, \sigma_{PBC}^{\lambda_1}, K, \sigma_{PBC}^{\lambda_4}, \sigma_{NBN}^{\lambda_1}, K, \sigma_{NBN}^{\lambda_4}, \sigma_{NBC}^{\lambda_1}, K, \sigma_{NBC}^{\lambda_4}\}$$

$$x = \{A, B_1, B_2, B_3, B_4, \beta_1, \beta_2, \beta_3, \beta_4, \gamma_1, \gamma_2, \gamma_3, \gamma_4, \alpha_1, \alpha_2, OV\}$$

and lb and ub are respectively the lower and upper bounds of variables, defined in order to tighten the search space of the optimization algorithm. The bounds are pre-determined based on the physical interpretation of the variables, e.g. A, $B_i$ representing the amplitudes of the diffracted waves and $\beta_i$ representing the phase difference of the diffracted waves between the two layers.

In order to efficiently solve this nonlinear constrained optimization problem, in an embodiment, nonlinear optimization algorithms are combined along with some mathematical techniques to avoid reaching only the local optima and to increase the speed of convergence. The following provides an overview of the algorithm and the steps taken to solve the problem:

1. Define the bounds lb, ub based on physical knowledge of values of parameters.
2. Replace $x_i$ in the objective function by $$\frac{lb_i + ub_i}{2} + \frac{ub_i - lb_i}{2} \cos(x_i').$$

The resulting optimization problem (based on the new variables $x_i'$) is therefore unconstrained.

3. Calculate the Jacobian of F':

$$\nabla F'(x') = \begin{bmatrix} \frac{\partial F_1'}{\partial x_1'} & \frac{\partial F_2'}{\partial x_1'} & \Lambda & \frac{\partial F_{16}'}{\partial x_1'} \\ \frac{\partial F_1'}{\partial x_2'} & \frac{\partial F_2'}{\partial x_2'} & \Lambda & \frac{\partial F_{16}'}{\partial x_2'} \\ M & M & O & M \\ \frac{\partial F_1'}{\partial x_{16}'} & \frac{\partial F_2'}{\partial x_{16}'} & \Lambda & \frac{\partial F_{16}'}{\partial x_{16}'} \end{bmatrix}$$

4. While n<N:
   4.1 Draw an initial point x'(0) from Uniform(0,π).
   4.2 For k≥0
   Calculate x'(k+1) using a modified Levenberg-Marquardt iteration algorithm:

$$x'(k+1) = x'(k) - \left( \frac{\zeta}{2} I + \nabla F'(x'(k)) \nabla^T F'(x'(k)) \right)^{-1} \nabla F'(x'(k)) F'(x'(k))$$

Compute the gradient of the objective function: $\nabla J(x(k+1)) = 2\nabla F'(x(k+1))F'(x(k+1))$ and take the maximum absolute value of the gradient vector as a stopping criterion if it is very close to zero. Otherwise, take the relative change in the value of x or the objective function as a stopping criterion.

4.3 Store the local optimal solution x* and J* corresponding to loop iteration n. Also report the corresponding stopping criterion that is met. Increase the outer loop counter (used for the multi-start of optimization) to n+1.
5. Calculate the minimum of the optimal objective functions J* (obtained for random initial points in the previous step). For the minimum of the optimal values, check whether the corresponding stopping criterion was the gradient-related one (i.e., gradient being very close to zero). In this case, report this objective value and the corresponding optimal point as the possible global solution.

It has been found that the behavior of parameter values for different targets on a substrate are comparable and seems stable. Thus, it is possible to use the results from a few targets to limit the range of the search space for parameter optimization, which can significantly boost the convergence speed of the optimization algorithm.

The above disclosure describes obtaining a system of equations (e.g., equations (9) to (24)) by performing multiple measurements of a target with multiple wavelengths (e.g., $\lambda_1 \ldots \lambda_4$ in the aforementioned equations). However, wavelength is only one example of an illumination condition which may be varied to obtain the system of equations. As such, the concepts described herein may be more generally applied to varying an illumination condition of the illumination radiation. For example, other illumination conditions which may be varied include polarization or angle of incidence.

The reason that combining images at different wavelengths is useful lies in the fact that many of the model parameters are wavelength-dependent (dependencies which are grouped together in a so-called swing curve as will be described in more detail later). Therefore, the images at different wavelengths can be thought of as independent samplings of the sensor and target taken together (so with all error sources and overlay combined). This independence is significant: each image provides unique information, which can be combined and separated by a well-chosen model. Measurements at different polarizations also highlight different interactions of radiation with the layer stack on a substrate, and therefore are (at least partially) independent. Measurements relating to different angles of incidence may require further consideration, as will now be explained.

In many metrology devices, such as that depicted in FIG. 7A, it is the aperture 13 that determines the illumination profile and therefore which angles of incidence are transmitted to the target. As with wavelength, the angle of incidence is a significant contributor to a swing curve (which is caused by interference of waves and material properties in the layer stack), and therefore different angles of incidence (i.e. different points in the pupil) can provide independent samplings of the system; the concept of the swing curve will be described in more detail below. Ideally, each wave with a different angle of incidence should be sampled independently (e.g., by scanning a laser over different angles). However, a typical metrology illumination source emits a continuum of waves at different angles simultaneously (since it is a partially coherent source). The sampling of the pupil is thus currently governed by the aperture. Many of the available apertures have overlapping illumination profiles with respect to each other, and thus do not provide fully independent samples of angle of incidence. This is fundamentally different from images taken at different wavelengths, where the wavelengths have no, or negligible, spectral overlap.

Therefore, a number of example methods will be described for which the varied illumination condition is extended to angle of incidence. Such methods may significantly increase the number of independent images which may be fed into a multi-image overlay extraction algorithm such as that described by equations (9) to (24). The central idea is that separate acquisitions of angle of incidence are performed, using the smallest possible unique sections of the pupil. This may be implemented in many different ways, of which a few will be illustrated.

A first method, which can involve no hardware change, comprises acquiring images using a plurality of apertures presently available in a metrology tool and making linear combinations of the intensities acquired, thereby creating essentially independent pupil samplings. This is a valid approach, since the images are formed by incoherent sums of all participating waves. For instance, one could acquire an image A using a first aperture plate defining a first illumination profile, and acquire image B using a second aperture plate defining a second illumination profile, wherein the first and second illumination profiles overlap such that the first illumination profile is (spatially) contained entirely within the second illumination profile. Once the images have been properly aligned, the difference of acquired image B and acquired image A could be determined so as to obtain a new derived image C (e.g., after careful normalization, by for example an energy sensor reading). As such, image C will (mostly) contain information from waves outside of the first aperture profile, but inside the second aperture profile. Therefore, acquired image A and derived image C should be substantially independent and can be used in the algorithm described by equations (9) to (24), where the term $\lambda_n$ will now denote these different images and therefore different angles of incidence. As such, from the different aperture plates which may be available, different bases of independent pupil samplings can be constructed. It may be noted that, while the linear combination example above comprises a difference between 2 images, the concept also applies to using a linear combinations of more than 2 images, so as to obtain different bases which better match an actual swing curve of the target.

An advantage of this method is that the aperture plates used for each measurement can be chosen to be larger than the sampled regions, meaning that blurring and edge effects are kept to a minimum in the images, and it can involve no hardware change to a metrology tool.

In a further method, the aperture profile may be selectable to define non-overlapping multiple profiles. For example, an aperture profile (or multiple aperture profiles) could be added to an Illumination Mode Selector (IMS), which can be moved continuously across the pupil by, e.g., rotating an IMS wheel with the one or more aperture profiles in small steps. In this way, the pupil can be continuously sampled, and optimal samplings may be identified. This provides more flexibility than using existing apertures as described above, since the regions that are sampled by the one or more aperture profiles are not fixed. Also, any image blurring due to these one or more small aperture profiles will be the same across the samplings. Several such aperture profiles of different lengths could be combined the same way as described in the approach with the existing apertures as described above, giving an even finer basis. Note that the one or more aperture profiles should not become so small as to blur the dark-field images too much.

The above solutions involve sequential acquisitions, which involves additional time, because they block relatively large pupil areas before the objective. However, parallel acquisitions of waves travelling at different angles can be obtained by using a wedge prism that projects different parts of the pupil to different regions of the sensor camera (e.g., 4 quadrants measured in a single-shot). Taking this wedge idea further, by projecting smaller regions of the pupil quadrants to separate regions of the sensor camera, "hyper-angular" measurements are possible, synonymous to parallel wavelengths being measured in a "hyper-spectral" setup. Such a system could be implemented using a finely segmented wedge or a spatial light modulator (SLM), which alters the phase of the radiation on a per-pixel basis. The SLM could replace the wedge, allowing for a dynamic choice of pupil regions to be sampled simultaneously (this might require a larger total CCD area at equal pixel density than is currently used for the sensor camera, to maintain proper resolution).

Figure 14:
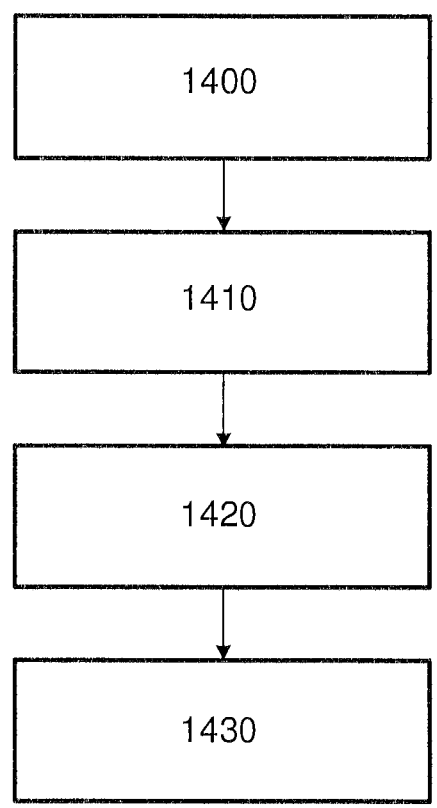
FIG. 14 is a flow chart of an embodiment of a method.

So, referring to FIG. 14, an embodiment of a method involving the multiple wavelength technique described above is schematically depicted. At 1400, a system of equations is provided as described herein. For example, the system of equations can have 16 or more equations and be a function of overlay and measurement radiation wavelength. At 1410, radiation values are obtained for use in solving the system of equations. In an embodiment, the radiation values can be measured from a physical target on a physical substrate. In an embodiment, the radiation values can be determined by a simulator that simulates illuminating the metrology target and detecting radiation redirected by the metrology target. At 1420, the radiation values are used with the system of equations to solve for one or more parameters of the equations. In an embodiment, a solved for parameter is overlay. In an embodiment, one or more the optimization techniques described above can be used. At 1430, an application is made of the solved for one or more parameters. For example, the solved for parameter can be overlay determined at high volume or as part of production and can be used to, e.g., control, design, etc. an aspect of a patterning process. As another example, the solved for parameter can be overlay determined for use in design, control, etc. of a metrology process, e.g., to select a condition of the metrology process such as radiation wavelength used for measurement (and which metrology process can use a different overlay calculation technique such as the techniques described above with respect to equations (1)-(4)). An example of the use of determined overlay for use in design, control, etc. of a metrology process is described below in relation to FIG. 15.

In sum, there is provided a new physical model for determining accurate overlay that is based on considering several parameters of the radiation scattering problem from a diffraction metrology target. This method can provide a more accurate determination of overlay and/or provide a robust calculation of overlay. In an embodiment, this is achieved based on a mathematical description of the scattering problem, wherein for each periodic structure of a plurality of periodic structures and for two diffraction orders of wave formation, a set of parameters of a system of non-linear equations is formed comprising a plurality of wavelengths and overlay as at least some of such parameters. With this description, it can be sufficient to measure 2 diffraction orders of at least 2 periodic structures (with 2 periodic structures having respectively a positive and negative bias) at a plurality of different wavelengths (e.g., 4 different wavelengths) to obtain a plurality of radiation values (e.g., 16 measured or simulated intensity values). With at least the plurality of radiation values and the wavelengths as known values, the system of non-linear equations can be solved, wherein a number of the parameters of the scattering problem, including overlay, are the unknowns.

Moreover, the system of equations can uniquely take into account the effects of structural asymmetry, stack difference and/or sensor asymmetry when calculating overlay. That is, one or more parameters of the system of equations are configured as described herein so as to incorporate the effect of structural asymmetry, stack difference and/or sensor asymmetry in the determination of the overlay value. Thus, this method can provide a more accurate estimation of overlay. Moreover, for sensor asymmetry, this method when configured with one or more parameters directed to sensor asymmetry as described herein may avoid a need for extra information from substrate rotation of 180 degrees used to eliminate sensor asymmetry. This is because the overlay determination can directly account for sensor asymmetry by having one or more parameters directed to sensor asymmetry in the system of equations.

As noted above, the technique described herein can be used as a default overlay calculation method for a metrology apparatus (e.g., instead of using equation (2) or equation (4)). In terms of throughput, the use of this technique can be possible if, e.g., switching between wavelengths is fast enough and/or the solving of the system of equations is fast enough. With advances in hardware, actual measurements at multiple wavelengths are possible using a fast hardware switch to switch between different wavelengths. In addition, the solving techniques described herein can enable speed improvement in terms of solving the non-linear system of equations to obtain, e.g., the overlay value. Therefore, this technique is promising as a default overlay calculation method.

Further, the measurement accuracy and/or sensitivity of a target may vary with respect to one or more attributes of the target itself and/or one or more attributes of the measurement radiation provided onto the target, for example, the wavelength of the radiation, the polarization of the radiation, and/or the intensity distribution (i.e., angular or spatial intensity distribution) of the radiation. In an embodiment, the wavelength range of the radiation is limited to one or more wavelengths selected from a range (e.g., selected from the range of about 400 nm to 900 nm). Further, a selection of different polarizations of the radiation beam may be provided and various illumination shapes can be provided using, for example, a plurality of different apertures.

So, to enable such selection and measurement, a metrology recipe can be used that specifies one or more parameters of the measurement using the measurement system. In an embodiment, the term "metrology recipe" includes one or more parameters of the measurement itself, one or more parameters of a pattern of the target measured, or both.

In this context, a pattern of the target measured (also referred to as a "target" or "target structure") may be a pattern that is optically measured, e.g., whose diffraction is measured. The target pattern measured may be a pattern specially designed or selected for measurement purposes. Multiple copies of a target may be placed on many places on a substrate.

In an embodiment, if the metrology recipe comprises one or more parameters of the measurement itself, the one or more parameters of the measurement itself can include one or more parameters relating to a measurement beam and/or measurement apparatus used to make the measurement. For example, if the measurement used in a metrology recipe is a diffraction-based optical measurement, one or more parameters of the measurement itself may include a wavelength of measurement radiation, and/or a polarization of measurement radiation, and/or measurement radiation intensity distribution, and/or an illumination angle (e.g., incident angle, azimuth angle, etc.) relative to the substrate of measurement radiation, and/or the relative orientation relative to a pattern on the substrate of diffracted measurement radiation, and/or a number of measured points or instances of the target, and/or the locations of instances of the target measured on the substrate. The one or more parameters of the measurement itself may include one or more parameters of the metrology apparatus used in the measurement, which can include detector sensitivity, numerical aperture, etc.

In an embodiment, if the metrology recipe comprises one or more parameters of a pattern measured, the one or more parameters of the pattern measured may include one or more geometric characteristics (such as a shape of at least part of the pattern, and/or orientation of at least part of the pattern, and/or a pitch of at least part of the pattern (e.g., pitch of a periodic structure including the pitch of an upper periodic structure in a layer above that of a lower periodic structure and/or the pitch of the lower periodic structure), and/or a size (e.g., CD) of at least part of the pattern (e.g., the CD of a feature of a periodic structure, including that of a feature of the upper periodic structure and/or the lower periodic structure), and/or a segmentation of a feature of the pattern (e.g., a division of a feature of a periodic structure into sub-structures), and/or a length of a periodic structure or of a feature of the periodic structure), and/or a materials property (e.g., refractive index, extinction coefficient, material type, etc.) of at least part of the pattern, and/or an identification of the pattern (e.g., distinguishing a pattern being from another pattern), etc.

A metrology recipe may be expressed in a form like ($r_1$, $r_2$, $r_3$, . . . $r_n$; $t_1$, $t_2$, $t_3$, . . . $t_m$), where $r_i$ are one or more parameters of the measurement and $t_j$ are one or more parameters of one or more patterns measured. As will be appreciated, n and m can be 1. Further, the metrology recipe does not need to have both one or more parameters of the measurement and one or more parameters of one or more patterns measured; it can have just one or more parameters of the measurement or have just one or more parameters of one or more patterns measured.

A target may be subjected to measurement using two metrology recipes A and B, e.g., differ on the stage at which a target is measured (e.g., A measures a target when it comprises a latent image structure and B measures a target when it doesn't comprise a latent image structure) and/or differ on the parameters of their measurement. Metrology recipes A and B can at least differ on the target measured (e.g., A measures a first target and B measures a second different target). Metrology recipes A and B may differ on the parameters of their measurement and target measurement. Metrology recipes A and B may not even be based on the same measurement technique. For example recipe A may be based on diffraction-based measurement and recipe B may be based on scanning electron microscope (SEM) or atomic force microscopy (AFM) measurement.

So, another possible application of the multiple wavelength technique described herein is for metrology recipe selection which is performed before, e.g., high volume or production measurements. Thus, the technique can be used to provide accurate overlay as a reference for metrology recipe selection. That is, it would be desirable, for example, to arrive at a desirably optimum selection of the metrology recipe (target-measurement parameter combination) so as to obtain more accurate process parameter measurement and/or that yields measurement values of the desired process parameter that is robust to process variability.

Accordingly, in an embodiment, to determine one or more metrology recipes that would yield an accurate measurement of the desired process parameter (e.g., overlay) and/or that yields measurement values of the desired process parameter that is robust to process variability, the result of the multiple wavelength technique described above can be used to identify such one or more accurate and/or robust metrology recipes.

Figure 15:
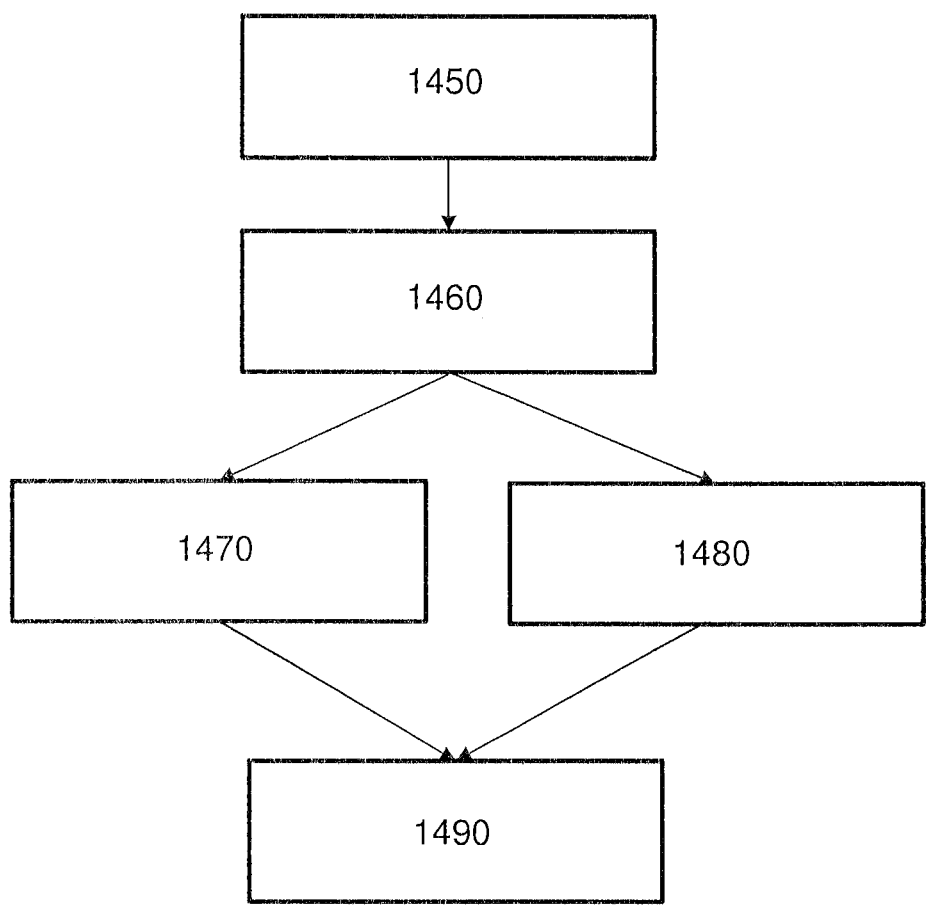
FIG. 15 is a flow chart of an embodiment of a method.

Referring to FIG. 15, an embodiment of a method of metrology recipe selection is schematically presented. In essence, the method involves using a first patterning process parameter determination technique (such as the multiple wavelength technique described above) to determine a first value of a patterning process parameter (such as overlay) from a metrology target illuminated by measurement radiation, using a second patterning process parameter determination technique (such as the techniques described above with respect to equations (1)-(4) or else another technique provided by, e.g., a metrology apparatus) different from the first patterning process parameter determination technique to arrive at a plurality of second values of the patterning process parameter (such as overlay) for the metrology target, each second value determined at a different wavelength of measurement radiation, and identifying, based on the first value and the second values, a measurement radiation wavelength for a metrology recipe for measurement of the metrology target. A more detailed example of this method using the multiple wavelength technique described above as the first patterning process parameter determination technique will now described in relation to FIG. 15.

At 1450, optionally, a pre-selection is performed to select a plurality of wavelengths of measurement radiation from a larger set of wavelengths of measurement radiation. Examples of such pre-selection will be described hereafter.

At 1460, a plurality of wavelengths (e.g., the pre-selected wavelength from 1450 or an otherwise provided plurality of wavelengths) are used in combination with a multiple wavelength system of equations as described above (e.g., a first overlay determination technique) to arrive at a first value of overlay. As will be appreciated, the number of wavelengths should match those for which the system of equations is set up. And if there are more, then a selection of the best wavelengths from the plurality of wavelengths that match the number needed for the system of equations can be selected. In an embodiment, the pre-selection technique provided a metric for each wavelength to enable selection of the best wavelengths. Or, various sub-combinations of the number of wavelengths used in the system of equations can be selected and the first value of overlay calculated therefor to arrive at a plurality of first values of overlay (which values can then be used separately or statistically combined, e.g., averaged to obtain an average first value of overlay). The radiation values used with the system of equations can be simulated values or physically measured values.

At 1470, for a situation where, for example, a metrology apparatus provides certain specific wavelengths, an overlay determination technique described above with respect to equations (1)-(4) or else another overlay determination technique provided by, e.g., a metrology apparatus (e.g., a second overlay determination technique) is used to derive a second value of the overlay for the metrology target at each of a plurality of wavelengths. In an embodiment, those wavelengths are all or a subset of the wavelengths provided by the metrology apparatus for which the metrology recipe is being selected. In an embodiment, those wavelengths are all or a subset of the wavelengths used at 1460. The radiation values used with the second overlay determination technique can be simulated values or physically measured values.

Then with the second values, a wavelength is chosen for which a second value of overlay is closest to the first value of overlay. So, in an embodiment, identifying the measurement recipe wavelength comprises identifying which of the second values determined using the second overlay determination technique (e.g., an overlay determination technique described above with respect to equations (1)-(4) or else another overlay determination technique provided by, e.g., a metrology apparatus) is closest to the first value determined using the first overlay determination technique (such as the multiple wavelength technique described above) and the identified measurement wavelength for the metrology recipe is then the measurement radiation wavelength associated with the closest second value. In an embodiment, more than one wavelength can be identified.

At 1480, for a situation where, for example, a metrology apparatus can flexibly provide wavelengths with a range of wavelengths (e.g., tune a particular wavelength out of a continuous range of wavelengths), an overlay determination technique described above with respect to equations (1)-(4) or else another overlay determination technique provided by, e.g., a metrology apparatus (e.g., a second overlay determination technique) is used to derive a second value of the overlay for the metrology target at each of a plurality of wavelengths. In an embodiment, those wavelengths are a sampling (e.g., an even sampling) of wavelengths across a range of wavelengths provided by the metrology apparatus for which the metrology recipe is being selected. In an embodiment, those wavelengths are all or a subset of the wavelengths used at 1460. The radiation values used with the second overlay determination technique can be simulated values or physically measured values.

Then with the second values, the second values are fitted as a function of wavelength. Then, an optimal wavelength is extrapolated or interpolated from this fit that has a second value that is equal to or closest to the first value of overlay. So, in an embodiment, identifying the measurement recipe wavelength comprises fitting the second values determined using the second overlay determination technique (e.g., an overlay determination technique described above with respect to equations (1)-(4) or else another overlay determination technique provided by, e.g., a metrology apparatus) as a function of measurement radiation wavelength and extrapolating or interpolating the identified measurement wavelength, from the fitting, that has a value of the overlay closest or equal to the first value determined using the first overlay determination technique (such as the multiple wavelength technique described above). In an embodiment, more than one wavelength can be identified.

At 1490, one or more metrology recipes are output for use with a metrology process of the metrology target, wherein the one or more metrology recipes each have an identified wavelength from 1460, 1470 or 1480. In an embodiment, the one or more metrology recipes have an identified wavelength from 1470 or 1480 and are for use with a metrology process that determines overlay using the second overlay determination technique (e.g., an overlay determination technique described above with respect to equations (1)-(4) or else another overlay determination technique provided by, e.g., a metrology apparatus). In an embodiment, a plurality of metrology recipes are provided, have an identified wavelength from 1460, 1470 or 1480, and are for use with a metrology process that determines overlay using the first overlay determination technique (e.g., the multiple wavelength technique described above).

Figure 16:
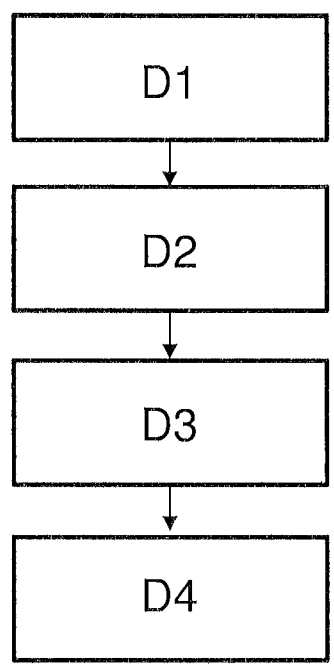
FIG. 16 is a flowchart illustrating a process in which the metrology target is used to monitor performance, and as a basis for controlling metrology, design and/or production processes.

FIG. 16 shows a flowchart illustrating a process in which the metrology recipe is used to monitor performance, and as a basis for controlling metrology, design and/or production processes. In step D1, substrates are processed to produce product features and one or more metrology targets as described herein according to the applicable metrology recipe. At step D2, patterning process parameter (e.g., overlay) values are measured using, if applicable, the one or more measurement parameters of the metrology recipe and calculated using, e.g., the method of FIG. 6 or 10. At optional step D3, the measured patterning process parameter (e.g., overlay) value may be used (together with other information as may be available), to update the metrology recipe (e.g., change a wavelength using a method as described herein). The updated metrology recipe is used for re-measurement of the patterning process parameter, and/or for measurement of the patterning process parameter on a subsequently processed substrate. In this way, the calculated patterning process parameter is improved in accuracy. The updating process can be automated if desired. In step D4, the patterning process parameter value is used to update a recipe that controls the lithographic patterning step and/or other process step in the device manufacturing process for re-work and/or for processing of further substrates. Again this updating can be automated if desired.

As noted above, a pre-selection can be used to arrive at certain wavelengths. While various steps are described in sequence hereafter for such pre-selection, they need not necessarily be performed in that sequence. Further, all steps need not be performed. For example, one or more of the step may be performed. So, any combination selected from the steps can be performed.

The pre-selection can involve an analysis of overlay data for a metrology target against a plurality of different wavelengths. The data can be obtained experimentally or obtained from production measurements using the target. For example, a plurality of instances of a target under consideration can be printed across a substrate using the patterning process for which the target will be used and then each instance measured with the applicable metrology apparatus at a plurality of different settings (e.g., different wavelengths). Additionally or alternatively, the overlay measurement resulting from using a metrology recipe to measure a target may be simulated. In the simulation, one or more parameters of the measurement are determined using (e.g., provided by, or determined from) the parameters $r_i$ and/or $t_j$ of the metrology recipe. For example, the interaction between the radiation and the target corresponding to the metrology recipe can be determined from those parameters of the metrology recipe by using, for example, a Maxwell solver and rigorous coupled-wave analysis (RCWA) or by other mathematical modelling. So, the measurement expected using the target and the associated metrology recipe can be determined from the interaction. So, in certain circumstances, for example to determine targets that yield strong signals, the data can be obtained using a simulator of the measurement process; the simulator can mathematically derive how a particular target of particular characteristics (e.g., a target specified in terms of pitch, feature width, material types, etc.) would be measured using a metrology apparatus according to the measurement technique (e.g., diffraction-based overlay measurement) of the inspection apparatus by, for example, calculating the intensity that would be measured in a detector of, e.g., the apparatus of FIG. 7. To obtain robustness data, the simulator can introduce a perturbation within a certain range (e.g., an up to 10% change, an up to 5% change, an up to 2% change, an up to 1% change, or an up to 0.5% change) to mimic process variation (which can be extended across a substrate).

So, the experimental method or simulation can yield values for particular parameters or indicators such as OV, K, etc. using, for example, the formulas described above.

One such indicator is stack sensitivity (SS) (also considered as signal contrast). Stack sensitivity can be understood as a measure of how much the intensity of the signal changes as overlay changes because of diffraction between target (e.g., grating) layers. That is, in an overlay context, it detects the contrast between upper and lower periodic structure of an overlay target and thus represents a balance between diffraction efficiencies between the upper and lower periodic structure. It is thus an example measure of sensitivity of the measurement. In an embodiment, stack sensitivity is the ratio between intensity asymmetry and average intensity. In an embodiment, stack sensitivity can be formulated as $SS=K \cdot L/I_M$, wherein L is a user defined constant (e.g., in an embodiment, the value L is 20 nm and/or the value of the bias d) and $I_M$ is the mean intensity of the measurement beam diffracted by the target. In an embodiment, the stack sensitivity for a metrology recipe should be maximized. However, it has been discovered that use of a metrology recipe with maximum stack sensitivity may not be best. For example, a measurement beam wavelength for which stack sensitivity is maximum may correspond to low overlay sensitivity and poor process robustness.

Figure 17:
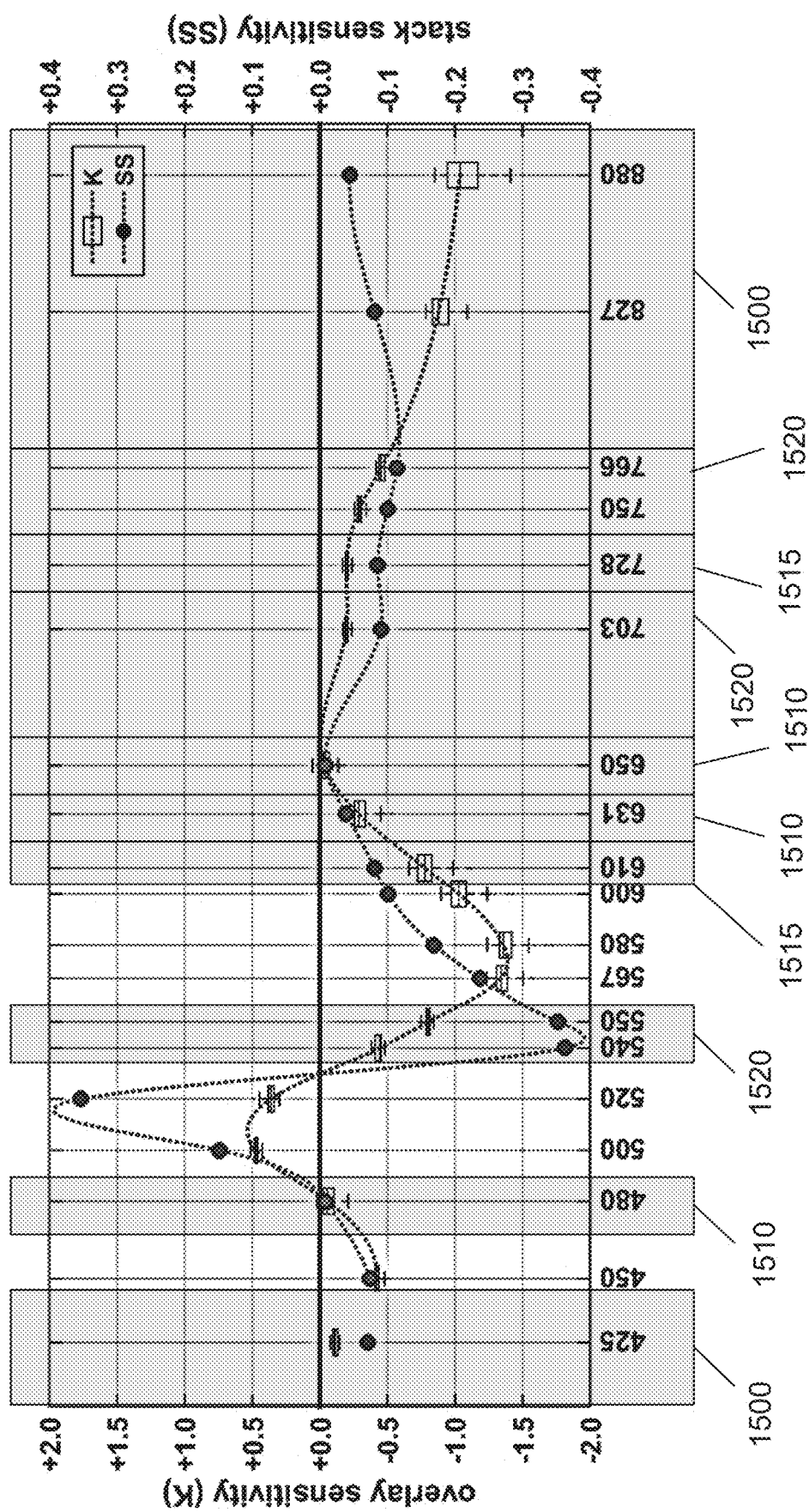
FIG. 17 is a graph of overlay sensitivity for a target for measurement at various wavelengths for a single polarization (in this case, linear X polarization)
Figure 18:
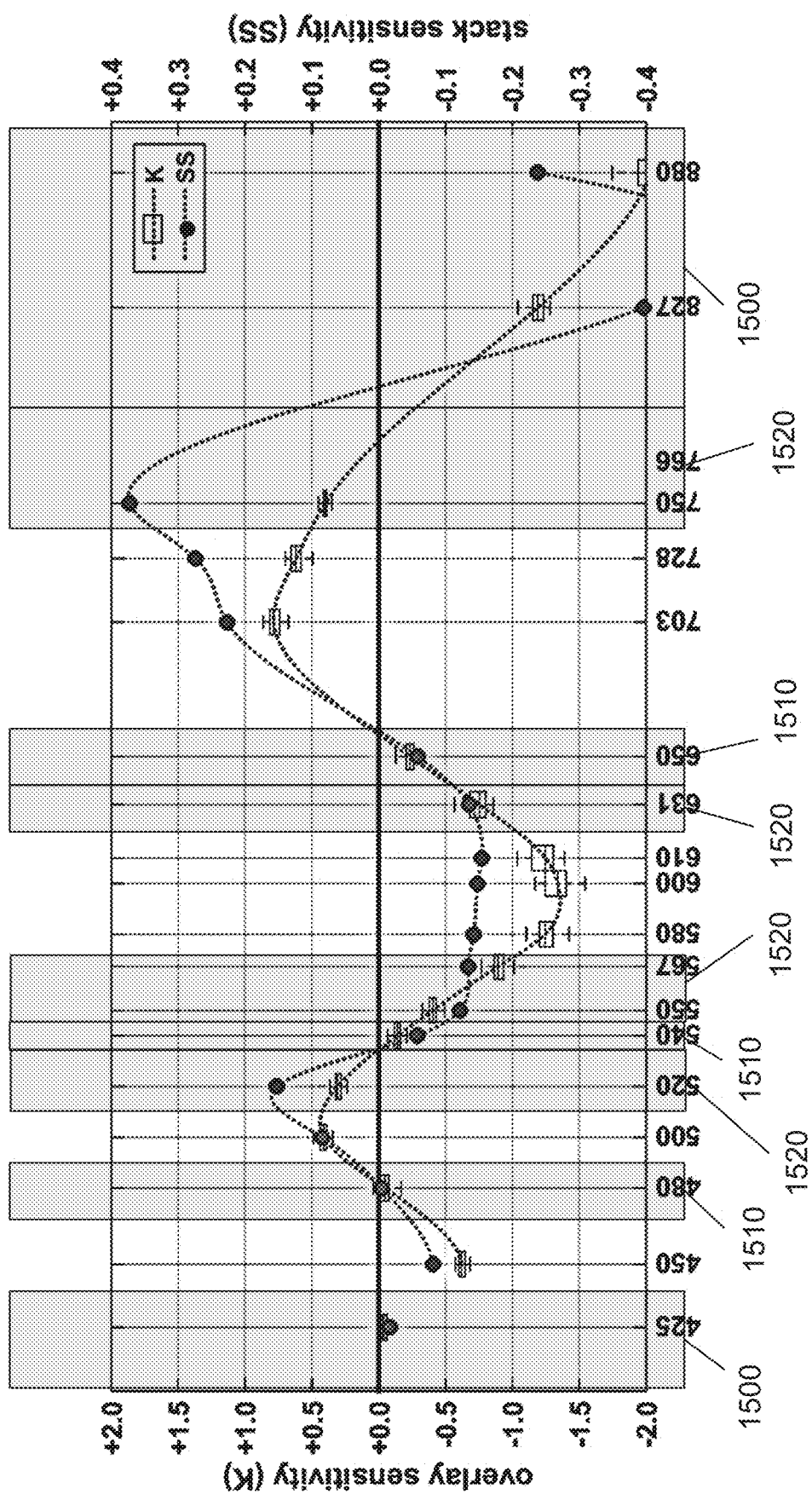
FIG. 18 is a graph of overlay sensitivity for a target for measurement at various wavelengths for a single polarization (in this case, linear Y polarization)

Examples of metrology recipe data are presented in FIGS. 17 and 18. The data can represent a dependency of measurement data as a function of one or more metrology recipe parameters, in particular one or more parameters of the measurement itself such as wavelength of the measurement beam. In an embodiment, the data can represent an oscillatory dependence of measured data (e.g., intensity obtained as field data (at an image plane) or pupil data (at pupil plane)) as a function of measurement radiation wavelength. FIG. 17 is an example graph of data for a target for measurement at various wavelengths for a single polarization (in this case, linear X polarization). A curve has been fitted through the data and so this representation can be called a swing curve. As will be appreciated, a graph need not be generated as just the data can be processed. FIG. 18 is a graph of data for the same target for measurement at various wavelengths for a different single polarization (in this case, linear Y polarization). In both FIGS. 17 and 18, stack sensitivity and overlay sensitivity are graphed for various measurement beam wavelengths. Further, while the polarizations here are linear X and Y polarization, it can be different or additional polarizations (such as left-handed elliptically polarized radiation, right-handed elliptically polarized radiation, etc.)

Using this data, one or more certain metrology recipes (e.g. wavelengths) are removed from consideration to result in a selection of a set of metrology recipes for possible further consideration. In this case, the metrology recipes share the same target but vary in terms of measurement radiation wavelength.

Now, certain wavelengths can be eliminated because they are beyond the pitch/wavelength limit for that particular target. That is, the pitch of the target features and the measurement radiation wavelength are such that measurement at this combination would be ineffective. These one or more metrology recipes are excluded in regions 1500.

A possible aspect of this selection is to select those one or more metrology recipes with a stack sensitivity (e.g., a mean stack sensitivity obtained from a plurality of instances of a target across a substrate (which can then be determined for a plurality of substrates)) that meets or crosses a threshold (i.e., within a certain range of stack sensitivity values). In an embodiment, the stack sensitivity should be maximized (but as discussed above, not at the expense of other indicators or parameters and moreover, there may be an upper limit on stack sensitivity that can affect robustness to process variation). For example, the one or more metrology recipes with an absolute value of stack sensitivity of greater than or equal to 0.05 can be selected for further consideration. Of course, 0.05 need not be used. If the number is higher in this case, more measurement recipes would be excluded. So, the stack sensitivity number in this case is relatively low. So, those one or more metrology recipes excluded by this aspect of the selection are marked as regions 1510 (where the regions roughly correspond to the wavelengths available by the inspection apparatus in this circumstance; the analysis as applied to the curve in FIGS. 17 and 18 would be more precise if a continuous wavelength range were available and the inspection apparatus can precisely and stably tune to any wavelength in the range).

A possible aspect of this selection is consideration of target sigma. Target sigma (TS) can be understood as the statistical variation of the measured parameter (e.g., overlay) for a plurality of measured pixels across a target. In theory, each pixel should be measured by a detector to read a same parameter value for a particular target. However, in practice, there can be variation among the pixels. In an embodiment, target sigma is in the form of a standard deviation or the form of variance. So, a low value of target sigma means a desirable low variation in the measured parameter across the target. A high value of target sigma (TS) can signal an issue in printing of the target (e.g., a misformed grating line), an issue of contamination (e.g., a significant particle on the target), an issue in measurement beam spot positioning, and/or an issue in measurement beam intensity variation across the target.

So, a further aspect of this selection can be to select those one or more metrology recipes with a target sigma (e.g., a mean target sigma obtained from a plurality of instances of a target across a substrate (which can then be determined for a plurality of substrates)) that meets or crosses a threshold (i.e., within a certain range of target sigma values). In an embodiment, the target sigma should be minimized. For example, the one or more metrology recipes with a target sigma of less than or equal to 10 nm can be selected for further consideration. Of course, 10 nm need not be used. If the number is lower in this case, more metrology recipes would be excluded. So, the target sigma number in this case is relatively high. So, those one or more metrology recipes excluded by this aspect of the selection are marked as regions 1515 (where the regions roughly correspond to the wavelengths available by the inspection apparatus in this circumstance).

To, e.g., reduce the measured error in overlay, a set of measurement conditions (e.g., target selection, measurement beam wavelength, measurement beam polarization, etc.) could be selected with a large overlay sensitivity K. So, a possible aspect of this selection is to select those one or more metrology recipes with an overlay sensitivity (e.g., a mean overlay sensitivity obtained from a plurality of instances of a target across a substrate (which can then be determined for a plurality of substrates)) that meets or crosses a threshold (i.e., within a certain range of overlay sensitivity values). In an embodiment, the overlay sensitivity should be maximized for a metrology recipe. For example, the one or more metrology recipes having an absolute value of overlay sensitivity within a range of the absolute value of highest overlay sensitivity can be selected for further consideration. For example, the range can be within 35%, within 30%, within 25%, within 20%, within 15% or within 10% of the highest overlay sensitivity value. For example, the one or more metrology recipes within a range from a local minima or maxima of the overlay sensitivity values can be selected. For example, the range can be within 35%, within 30%, within 25%, within 20%, within 15%, or within 10% of the local minima or maxima. Of course, different ranges can be used. The higher the range, the more metrology recipes retained. So, those one or more metrology recipes excluded by this aspect of the selection are marked as regions 1520 (where the regions roughly correspond to the wavelengths available by the inspection apparatus in this circumstance).

A possible aspect of this selection is consideration of a stack difference parameter against a threshold. In an embodiment, the stack difference parameter comprises grating imbalance (GI). So, for example, a subset of one or more metrology recipes can be selected by evaluating grating imbalance (GI) (e.g., a mean grating imbalance or a variation (e.g., variance, standard deviation, etc.) of grating imbalance, obtained from a plurality of instances of a target across a substrate (which can then be determined for a plurality of substrates)) against a threshold. For example, the one or more metrology recipes with a grating imbalance of less than or equal 0.05 or 5% can be selected for further consideration. Of course, 0.05 or 5% need not be used. In an embodiment, the stack difference parameter is minimized.

A possible aspect of this selection is evaluating a self-referential indicator (obtained from a plurality of instances of a target across a substrate (which can then be determined for a plurality of substrates)) against a threshold. In an embodiment, the self-referential indicator is, or involves, a self-reference performance parameter (e.g. overlay) obtained using the A+ versus A− analysis described in PCT patent application publication no. WO 2015/018625, which is incorporated herein in its entirety by reference.

The A+ versus A− analysis in the present context would mean evaluating the metrology recipes for a plurality of instances of a target having a periodic structure with a positive bias (A+) and a periodic structure with a negative bias (A−). So, for overlay as the performance parameter, A+ and A− is determined for each of the metrology recipes and for each instance of the target and the determined values of A+ are evaluated against the determined values of A− to yield a fitting through such data and a value related to that fitting corresponds to a more accurate value of the actual overlay for an instance of a target. This would be repeated for each instance of the target to yield a plurality of values of the self-reference performance parameter. In an embodiment, those plurality of values are averaged to yield an average (e.g., mean) more accurate value of the actual overlay across the substrate (where it is assumed that each instance of target is intended to have the same overlay).

Figure 19:
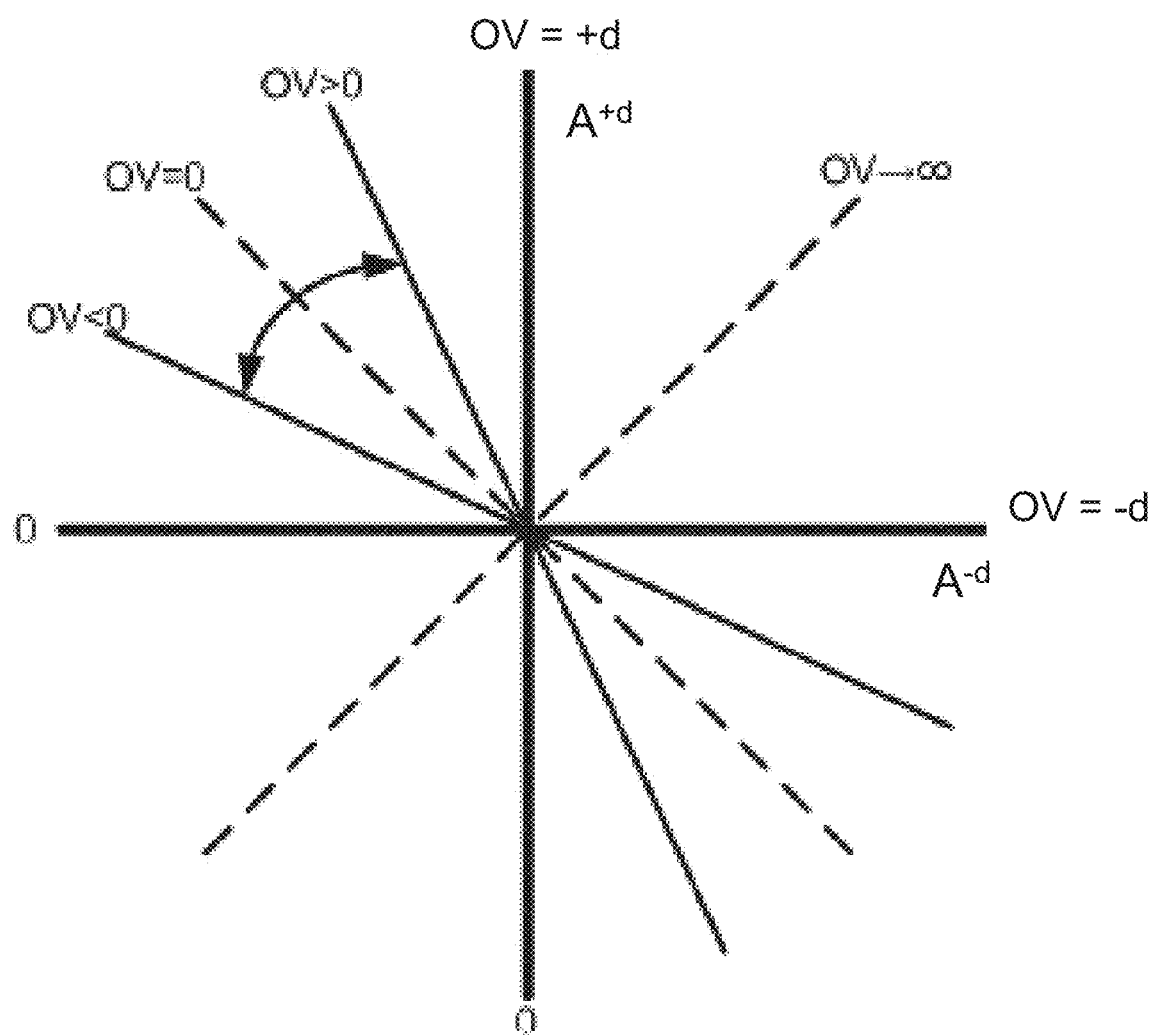
FIG. 19 is a plot of A+ versus A− for overlay gratings that have no feature asymmetry.

FIG. 19 is an example plot of A+ versus A− for overlay gratings that have no feature asymmetry, such that the only asymmetry present is the asymmetry due to the bias and overlay, to show the fitting. In this case, the relation between A+ and A− lies on a straight line through the origin (because no feature asymmetry is assumed). The corresponding A+ versus A− data points for all the metrology recipes lay on this line. The slope of this line (which is the fitting) is related to a more accurate value of the actual overlay. FIG. 19 shows a dotted line labelled OV=0, which is a line indicating zero overlay and having a slope of −1, a dotted line labelled OV∞, which is a line having a slope of +1 and is indicative of overlay approaching infinity, a solid line labelled OV<0, which is a line having a slope less than −1 and is indicative of overlay less than zero, and a solid line labelled OV>0, which is a line having a slope greater than −1 and is indicative of overlay greater than zero. Additionally, it can be seen that overlay equal to +d, where d is the grating bias, would result in a plotted line along the y-axis; and overlay equal to −d would result in a plotted line along the x-axis.

So, A+ versus A− regression can yield a more accurate value of overlay as it would be without a contribution attributable to feature asymmetry, by determination of the slope of a fitted line through the data set, the line not necessarily being fitted through the origin. Optionally, feature asymmetry could be determined via an offset of the fitted line from the origin (e.g., an intercept term).

Further, an actual measured value of overlay can be determined for each of the instances of the target as well as for each metrology recipe (where it is assumed that each instance of target is intended to have the same overlay). These values can be statistically processed to yield an average and a statistical variation (e.g., a standard deviation) of overlay for a particular metrology recipe.

Then, the self-referential indicator can be a comparison between the determined more accurate value of overlay and the measured value of overlay for a particular metrology recipe. In an embodiment, the self-referential indicator is a difference between the determined average more accurate value of actual overlay and the average measured value of overlay plus 3 standard deviations, which can be evaluated against a threshold (e.g., the metrology recipe will be selected if the self-referential indicator in this case is less than or equal to 3 nm, although a different value than 3 nm can be used). Thus, this self-referential indicator is effectively a residual fingerprint across the substrate. In an embodiment, the self-referential indicator should be minimized.

So, in effect, this technique involves fitting the asymmetries of periodic structures (e.g., biased overlay gratings) detected using a number of different metrology recipes across the substrate to produce a self-reference fingerprint of a more accurate value of a process parameter (e.g., overlay.) The self-reference more accurate process parameter value (e.g., overlay) is then compared with a measured value of the process parameter (e.g., overlay) of one or more metrology recipes to identify which one or more metrology recipe yields results close to the self-reference fingerprint to help assure accuracy of measurement using those one or more metrology recipes.

As a result, one or more metrology recipes (e.g., measurement wavelengths) should remain after one or more of the foregoing evaluations (of course, if no metrology recipes remain then one or more other metrology recipe parameters may need to be modified, e.g., one or more parameters of the target itself). At this point, the one or more selected metrology recipes could be output for the pre-selection and used in step 1460.

So, in an embodiment, there is provided a method to accurately calculate overlay using, e.g., the multiple wavelength technique described above and consequently, that accurate overlay is used to guide the selection of an optimal metrology recipe such that the measured overlay using that metrology recipe is more or most accurate. Thus, rather than a recipe selection algorithm to arrive at an "optimum" metrology recipe for accurate overlay based on approximation and heuristic steps, a methodology as described herein applies the multiple wavelength technique described above to recipe selection, therefore providing metrology recipe selection using a more analytically grounded formalism.

As a further note, even if one is bound by constraints to work with non-optimal wavelengths, for a majority of cases, as long as stack sensitivity is not too low (i.e. the inputs are not too noisy), the multiple wavelength technique described above can still determine accurate overlay (for any application such as for metrology recipe selection or for use in high volume or production measurement). A penalty for working with non-optimal wavelengths can be less accurate overlay in the situation where the inputs are too noisy (e.g., low stack sensitivity) and/or the wavelengths are too far from each other and the material of the metrology target is largely wavelength dependent. But, in most cases, these situations are not likely to arise in a proper designed metrology process with a properly designed metrology target.

In an embodiment, there is provided a method of determining a patterning process parameter from a metrology target, the method comprising: obtaining a plurality of values of diffraction radiation from the metrology target, each value of the plurality of values corresponding to a different wavelength of a plurality of wavelengths of illumination radiation for the target; and using the combination of values to determine a same value of the patterning process parameter for the target.

In an embodiment, the values of diffraction radiation are obtained for each of at least four wavelengths of the plurality of wavelengths. In an embodiment, the target comprises at least two sub-targets, each sub-target having a different bias and each of the values correspond to diffraction radiation from a particular sub-target. In an embodiment, the values separately correspond to radiation of a positive value of a certain diffraction order of the diffraction radiation and to radiation of a negative value of the certain diffraction order of the diffraction radiation. In an embodiment, using the combination of values to determine the same value of the patterning process parameter comprises using a system of equations comprising each of the plurality of wavelengths as a variable of at least one equation of the system of equations. In an embodiment, the system of equations comprises at least 16 equations. In an embodiment, the system of equations comprises at most 16 unknowns. In an embodiment, the target comprises an upper periodic structure and a lower periodic structure, wherein each equation of the system of equations comprises one or more terms that are a function of a variable representing amplitude of radiation from the lower periodic structure of the target and a variable representing phase of radiation from the target, and wherein at least an amplitude variable of radiation for a positive value of a certain diffraction order of the diffraction radiation is different from an amplitude variable of radiation for a negative value of the certain diffraction order of the diffraction radiation and at least a phase variable of radiation for the positive value of the certain diffraction order of the diffraction radiation is different from a phase variable of radiation for the negative value of the certain diffraction order of the diffraction radiation. In an embodiment, the target comprises a sub-target of the target with a positive bias of a periodic structure and a sub-target of the target with a negative bias of a periodic structure, wherein each equation of the system of equations comprises one or more terms that are a function of a variable representing amplitude of radiation from the target and a variable representing phase of radiation from the target, and wherein at least an amplitude variable of radiation for the sub-target with the positive bias is different from an amplitude variable of radiation for the sub-target with the negative bias and at least a phase variable of radiation for the sub-target with the positive bias is different from a phase variable of radiation for the sub-target with the negative bias. In an embodiment, each equation of the system of equations comprises one or more terms that are a function of a variable representing sensor asymmetry error. In an embodiment, at least a sensor asymmetry error variable of radiation for a positive value of a certain diffraction order of the diffraction radiation is different from a sensor asymmetry error variable of radiation for a negative value of the certain diffraction order of the diffraction radiation. In an embodiment, using the system of equations comprises solving a nonlinear system of equations to arrive at the value of the patterning process parameter. In an embodiment, the patterning process parameter is overlay. In an embodiment, the values of diffraction radiation are diffraction values obtained from measurement of the metrology target on a substrate processed using a patterning process. In an embodiment, the values of diffraction radiation are diffraction values obtained from simulation of the measurement of the metrology target.

In an embodiment, there is provided a method comprising: using a first patterning process parameter determination technique to determine a first value of a patterning process parameter from a metrology target illuminated by measurement radiation; using a second patterning process parameter determination technique different from the first patterning process parameter determination technique to arrive at a plurality of second values of the patterning process parameter for the metrology target, each second value determined at a different wavelength of measurement radiation; and identifying, based on the first value and the second values, a measurement radiation wavelength for a metrology recipe for measurement of the metrology target.

In an embodiment, the identifying comprises identifying which of the second values is closest to the first value and the identified measurement wavelength is the measurement radiation wavelength associated with the closest second value. In an embodiment, the identifying comprises fitting the second values as a function of measurement radiation wavelength and extrapolating or interpolating the identified measurement wavelength, from the fitting, that has a value of the patterning process parameter closest or equal to the first value. In an embodiment, the first patterning process parameter determination technique comprises: obtaining a plurality of values of diffraction radiation from the metrology target, each value of the plurality of values corresponding to a different wavelength of a plurality of wavelengths of measurement radiation for the target; and using the combination of values to determine a same value of the patterning process parameter for the target. In an embodiment, the method further comprises comprising performing a pre-selection of the plurality of wavelengths from a larger set of wavelengths based on a metric. In an embodiment, the metric comprises stack sensitivity being at or below a certain threshold. In an embodiment, the values of diffraction radiation are obtained for each of at least four wavelengths of the plurality of wavelengths. In an embodiment, the target comprises at least two sub-targets, each sub-target having a different bias and each of the values correspond to diffraction radiation from a particular sub-target. In an embodiment, the values separately correspond to radiation of a positive value of a certain diffraction order of the diffraction radiation and to radiation of a negative value of the certain diffraction order of the diffraction radiation. In an embodiment, using the combination of values to determine the same value of the patterning process parameter comprises using a system of equations comprising each of the plurality of wavelengths as a variable of at least one equation of the system of equations. In an embodiment, the system of equations comprises at least 16 equations. In an embodiment, the system of equations comprises at most 16 unknowns. In an embodiment, using the system of equations comprises solving a nonlinear system of equations to arrive at the value of the patterning process parameter. In an embodiment, the patterning process parameter is overlay. In an embodiment, the values are obtained from measurement of the metrology target on a substrate processed using a patterning process. In an embodiment, the values are obtained from simulation of the measurement of the metrology target.

While the embodiments disclosed above are described in terms of diffraction based overlay measurements in a field plane (e.g., measurements made using the second measurement branch of the apparatus shown in FIG. 7A), in principle the same models can be used for pupil based overlay measurements (e.g., measurements made using the first measurement branch of the apparatus shown in FIG. 7A). Consequently, it should be appreciated that the concepts described herein are equally applicable to diffraction based overlay measurements in the field plane and pupil plane.

While embodiments of the metrology target and process parameters described herein have mostly been described in the terms of an overlay target used to measure overlay, embodiments of the metrology target described herein may be used to measure one or more additional or alternative patterning process parameters. For example, the metrology target may be used to measure exposure dose variation, measure exposure focus/defocus, measure edge placement error, measure CD, etc. Further, the description here may also apply, with modifications as appropriate, to, e.g., substrate and/or patterning device alignment in a lithographic apparatus using an alignment mark. Similarly, the appropriate recipe for the alignment measurement may be determined.

So, while a performance parameter of interest is overlay, other parameters (e.g., dose, focus, CD, etc.) of performance of the patterning process can be determined using the methods described herein with, e.g., appropriate modifications to the multiple wavelength equations. The performance parameter (e.g., overlay, CD, focus, dose, etc.) can be fed back (or fed forward) for improvement of the patterning process, improvement of the target, and/or used to improve the modeling, measurement and calculation processes described herein.

While the target structures described above are metrology targets specifically designed and formed for the purposes of measurement, in other embodiments, properties may be measured on targets which are functional parts of devices formed on the substrate. Many devices have regular, periodic structures akin to a grating. The term "target", "grating" or "periodic structure" of a target as used herein does not require that the applicable structure has been provided specifically for the measurement being performed. Further, pitch P of the metrology target is close to the resolution limit of the optical system of the measurement tool, but may be much larger than the dimension of typical product features made by a patterning process in the target portions C. In practice the features and/or spaces of the periodic structures may be made to include smaller structures similar in dimension to the product features.

In association with the physical structures of the targets as realized on substrates and patterning devices, an embodiment may include a computer program containing one or more sequences of machine-readable instructions and/or functional data describing the target design, describing a method of designing a target for a substrate, describing a method of producing a target on a substrate, describing a method of measuring a target on a substrate and/or describing a method of analyzing a measurement to obtain information about a patterning process. This computer program may be executed for example within unit PU in the apparatus of FIG. 7 and/or the control unit LACU of FIG. 2. There may also be provided a data storage medium (e.g., semiconductor memory, magnetic or optical disk) having such a computer program stored therein. Where an existing inspection apparatus, for example of the type shown in FIG. 7, is already in production and/or in use, an embodiment can be implemented by the provision of an updated computer program product for causing a processor to perform one or more of the methods described herein. The program may optionally be arranged to control the optical system, substrate support and the like to perform a method of measuring a parameter of the patterning process on a suitable plurality of targets. The program can update the lithographic and/or metrology recipe for measurement of further substrates. The program may be arranged to control (directly or indirectly) the lithographic apparatus for the patterning and processing of further substrates.

Further, embodiments have been described herein in relation to diffraction-based metrology, which, for example, measures the relative position of overlapping periodic structures from the intensity from the diffracted orders. However, embodiments herein may be applied, with appropriate modification where needed, to image-based metrology, which, for example, measures the relative position from target 1 in layer 1 to target 2 in layer 2 using high-quality images of the targets. Usually these targets are periodic structures or "boxes" (Box-in-Box (BiB)).

The term "optimizing" and "optimization" as used herein refers to or means adjusting an apparatus and/or process of the patterning process, which may include adjusting a lithography process or apparatus, or adjusting the metrology process or apparatus (e.g., the target, measurement tool, etc.), such that a figure of merit has a more desirable value, such as measurement, patterning and/or device fabrication results and/or processes have one or more desirable characteristics, projection of a design layout on a substrate being more accurate, a process window being larger, etc. Thus, optimizing and optimization refers to or means a process that identifies one or more values for one or more design variables that provide an improvement, e.g. a local optimum, in a figure of merit, compared to an initial set of values of the design variables. "Optimum" and other related terms should be construed accordingly. In an embodiment, optimization steps can be applied iteratively to provide further improvements in one or more figures of merit.

An embodiment of the invention may take the form of a computer program containing one or more sequences of machine-readable instructions describing a method as disclosed herein, or a data storage medium (e.g. semiconductor memory, magnetic or optical disk) having such a computer program stored therein. Further, the machine readable instruction may be embodied in two or more computer programs. The two or more computer programs may be stored on one or more different memories and/or data storage media.

One or more aspects disclosed herein may be implemented in a control system. Any control system described herein may each or in combination be operable when the one or more computer programs are read by one or more computer processors located within at least one component of an apparatus. The control systems may each or in combination have any suitable configuration for receiving, processing, and sending signals. One or more processors are configured to communicate with the at least one of the control systems. For example, each control system may include one or more processors for executing the computer programs that include machine-readable instructions for the methods described above. The control systems may include data storage medium for storing such computer programs, and/or hardware to receive such medium. So the control system(s) may operate according the machine readable instructions of one or more computer programs.

Although specific reference may have been made above to the use of embodiments in the context of optical lithography, it will be appreciated that embodiments of the invention may be used in other applications, for example imprint lithography, and where the context allows, is not limited to optical lithography. In imprint lithography, a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g., having a wavelength of or about 365, 355, 248, 193, 157 or 126 nm) and extreme ultra-violet (EUV) radiation (e.g., having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

The foregoing description of the specific embodiments reveals the general nature of embodiments of the invention such that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description by example, and not of limitation, such that the terminology or phraseology of the present specification is to be interpreted by the skilled artisan in light of the teachings and guidance.

Further embodiments are described in below numbered clauses:

1. A method of determining a patterning process parameter from a metrology target, the method comprising:
obtaining a plurality of values of diffraction radiation from the metrology target, each value of the plurality of values corresponding to a different illumination condition of a plurality of illumination conditions of illumination radiation for the target; and
using the combination of values to determine a same value of the patterning process parameter for the target.
2. The method of clause 1, wherein the values of diffraction radiation are obtained for each of at least four illumination conditions of the plurality of illumination conditions.
3. The method of clause 1 or clause 2, wherein the target comprises at least two sub-targets, each sub-target having a different bias and each of the values correspond to diffraction radiation from a particular sub-target.
4. The method of any of clauses 1-3, wherein the values separately correspond to radiation of a positive value of a certain diffraction order of the diffraction radiation and to radiation of a negative value of the certain diffraction order of the diffraction radiation.
5. The method of any of clauses 1-4, wherein using the combination of values to determine the same value of the patterning process parameter comprises using a system of equations comprising each of the plurality of illumination conditions as a variable of at least one equation of the system of equations.
6. The method of clause 5, wherein the system of equations comprises at least 16 equations.
7. The method of clause 5 or clause 6, wherein the system of equations comprises at most 16 unknowns.
8. The method of any of clauses 5-7, wherein the target comprises an upper periodic structure and a lower periodic structure, wherein each equation of the system of equations comprises one or more terms that are a function of a variable representing amplitude of radiation from the lower periodic structure of the target and a variable representing phase of radiation from the target, and wherein at least an amplitude variable of radiation for a positive value of a certain diffraction order of the diffraction radiation is different from an amplitude variable of radiation for a negative value of the certain diffraction order of the diffraction radiation and at least a phase variable of radiation for the positive value of the certain diffraction order of the diffraction radiation is different from a phase variable of radiation for the negative value of the certain diffraction order of the diffraction radiation.
9. The method of any of clauses 5-8, wherein the target comprises a sub-target of the target with a positive bias of a periodic structure and a sub-target of the target with a negative bias of a periodic structure, wherein each equation of the system of equations comprises one or more terms that are a function of a variable representing amplitude of radiation from the target and a variable representing phase of radiation from the target, and wherein at least an amplitude variable of radiation for the sub-target with the positive bias is different from an amplitude variable of radiation for the sub-target with the negative bias and at least a phase variable of radiation for the sub-target with the positive bias is different from a phase variable of radiation for the sub-target with the negative bias.
10. The method of any of clauses 5-9, wherein each equation of the system of equations comprises one or more terms that are a function of a variable representing sensor asymmetry error.
11. The method of clause 10, wherein at least a sensor asymmetry error variable of radiation for a positive value of a certain diffraction order of the diffraction radiation is different from a sensor asymmetry error variable of radiation for a negative value of the certain diffraction order of the diffraction radiation.
12. The method of any of clauses 5-11, wherein using the system of equations comprises solving a nonlinear system of equations to arrive at the value of the patterning process parameter.
13. The method of any of clauses 1-12, wherein the patterning process parameter is overlay.
14. The method of any of clauses 1-13, wherein the values of diffraction radiation are diffraction values obtained from measurement of the metrology target on a substrate processed using a patterning process.

15. The method of any of clauses 1-14, wherein the values of diffraction radiation are diffraction values obtained from simulation of the measurement of the metrology target.

16. The method of any of clauses 1-15, wherein the illumination condition comprises wavelength and/or polarization.

17. The method of any of clauses 1-15, wherein the illumination condition comprises angle of incidence with respect to the target.

18. The method of clause 17, wherein the plurality of values of diffraction radiation include those which each relate to a corresponding image, each of the images corresponding to a different non-overlapping illumination profile of the illumination radiation.

19. The method of clause 18, wherein the images include one or more derived images, each of the one or more derived images being obtained from a linear combination of two or more acquired images so as to remove information relating to portions of an acquisition illumination profile of at least one of the acquired images which overlaps with an acquisition illumination profile relating to another of the acquired images, the acquisition illumination profiles comprising the actual illumination profiles used in acquisition of the acquired images.

20. A method comprising:
    using a first patterning process parameter determination technique to determine a first value of a patterning process parameter from a metrology target illuminated by measurement radiation;
    using a second patterning process parameter determination technique different from the first patterning process parameter determination technique to arrive at a plurality of second values of the patterning process parameter for the metrology target, each second value determined at a different illumination condition of measurement radiation; and
    identifying, based on the first value and the second values, a measurement radiation illumination condition for a metrology recipe for measurement of the metrology target.

21. The method of clause 20, wherein the identifying comprises identifying which of the second values is closest to the first value and the identified measurement illumination condition is the measurement radiation illumination condition associated with the closest second value.

22. The method of clause 20, wherein the identifying comprises fitting the second values as a function of measurement radiation illumination condition and extrapolating or interpolating the identified measurement illumination condition, from the fitting, that has a value of the patterning process parameter closest or equal to the first value.

23. The method of any of clauses 20-22, wherein the first patterning process parameter determination technique comprises:
    obtaining a plurality of values of diffraction radiation from the metrology target, each value of the plurality of values corresponding to a different illumination condition of a plurality of illumination conditions of measurement radiation for the target; and
    using the combination of values to determine a same value of the patterning process parameter for the target.

24. The method of clause 23, further comprising performing a pre-selection of the plurality of illumination conditions from a larger set of illumination conditions based on a metric.

25. The method of clause 24, wherein the metric comprises stack sensitivity being at or below a certain threshold.

26. The method of any of clauses 23-25, wherein the values of diffraction radiation are obtained for each of at least four illumination conditions of the plurality of illumination conditions.

27. The method of any of clauses 23-26, wherein the target comprises at least two sub-targets, each sub-target having a different bias and each of the values correspond to diffraction radiation from a particular sub-target.

28. The method of any of clauses 23-27, wherein the values separately correspond to radiation of a positive value of a certain diffraction order of the diffraction radiation and to radiation of a negative value of the certain diffraction order of the diffraction radiation.

29. The method of any of clauses 23-28, wherein using the combination of values to determine the same value of the patterning process parameter comprises using a system of equations comprising each of the plurality of illumination conditions as a variable of at least one equation of the system of equations.

30. The method of clause 29, wherein the system of equations comprises at least 20 equations.

31. The method of clause 29 or clause 30, wherein the system of equations comprises at most 20 unknowns.

32. The method of any of clauses 29-31, wherein using the system of equations comprises solving a nonlinear system of equations to arrive at the value of the patterning process parameter.

33. The method of any of clauses 20-32, wherein the patterning process parameter is overlay.

34. The method of any of clauses 20-33, wherein the values are obtained from measurement of the metrology target on a substrate processed using a patterning process.

35. The method of any of clauses 20-34, wherein the values are obtained from simulation of the measurement of the metrology target.

36. The method of any of clauses 20-35, wherein the illumination condition comprises wavelength and/or polarization.

37. The method of any of clauses 20-35, wherein the illumination condition comprises angle of incidence with respect to the target.

38. A measurement method comprising measuring a metrology target on a substrate according to the metrology recipe of any of clauses 20 to 37.

39. A metrology apparatus for measuring a parameter of a lithographic process, the metrology apparatus being operable to perform the method of any of clauses 1 to 38.

40. A non-transitory computer program product comprising machine-readable instructions for causing a processor to cause performance of the method of any of clauses 1-38.

41. A system comprising:
    an inspection apparatus configured to provide a beam of radiation on a metrology target on a substrate and to detect radiation diffracted by the target; and
    the non-transitory computer program product of clause 40.

42. The system of clause 41, further comprising a lithographic apparatus comprising a support structure configured to hold a patterning device to modulate a radiation beam and a projection optical system arranged to project the modulated radiation beam onto a radiation-sensitive substrate.

The breadth and scope of the present invention should not be limited by any of the above-described exemplary embodiments, but should be defined only in accordance with the following claims and their equivalents.

The invention claimed is:

1. A method of determining a patterning process parameter from a metrology target, the method comprising:
   obtaining a plurality of values of diffraction radiation from the metrology target, each value of the plurality of values corresponding to a different illumination condition of a plurality of illumination conditions of illumination radiation for the target; and
   using, by a hardware computer system, the combination of values to determine a same value of the patterning process parameter for the target by solving a system of equations comprising each of the plurality of illumination conditions as a variable of at least one equation of the system of equations.

2. The method of claim 1, wherein the values of diffraction radiation are obtained for each of at least four illumination conditions of the plurality of illumination conditions.

3. The method of claim 1, wherein the target comprises at least two sub-targets, each sub-target having a different bias and each of the values correspond to diffraction radiation from a particular sub-target.

4. The method of claim 1, wherein the values separately correspond to radiation of a positive value of a certain diffraction order of the diffraction radiation and to radiation of a negative value of the certain diffraction order of the diffraction radiation.

5. The method of claim 1, wherein the system of equations comprises at least 16 equations.

6. The method of claim 1, wherein the system of equations comprises at most 16 unknowns.

7. The method of claim 1, wherein the target comprises an upper periodic structure and a lower periodic structure, wherein each equation of the system of equations comprises one or more terms that are a function of a variable representing amplitude of radiation from the lower periodic structure of the target and a variable representing phase of radiation from the target, and wherein at least an amplitude variable of radiation for a positive value of a certain diffraction order of the diffraction radiation is different from an amplitude variable of radiation for a negative value of the certain diffraction order of the diffraction radiation and at least a phase variable of radiation for the positive value of the certain diffraction order of the diffraction radiation is different from a phase variable of radiation for the negative value of the certain diffraction order of the diffraction radiation.

8. The method of claim 1, wherein the target comprises a sub-target of the target with a positive bias of a periodic structure and a sub-target of the target with a negative bias of a periodic structure, wherein each equation of the system of equations comprises one or more terms that are a function of a variable representing amplitude of radiation from the target and a variable representing phase of radiation from the target, and wherein at least an amplitude variable of radiation for the sub-target with the positive bias is different from an amplitude variable of radiation for the sub-target with the negative bias and at least a phase variable of radiation for the sub-target with the positive bias is different from a phase variable of radiation for the sub-target with the negative bias.

9. The method of claim 1, wherein each equation of the system of equations comprises one or more terms that are a function of a variable representing sensor asymmetry error.

10. The method of claim 9, wherein at least a sensor asymmetry error variable of radiation for a positive value of a certain diffraction order of the diffraction radiation is different from a sensor asymmetry error variable of radiation for a negative value of the certain diffraction order of the diffraction radiation.

11. The method of claim 1, wherein solving the system of equations comprises solving a nonlinear system of equations to arrive at the value of the patterning process parameter.

12. The method of claim 1, wherein the patterning process parameter is overlay.

13. The method of claim 1, wherein the values of diffraction radiation are diffraction values obtained from measurement of the metrology target on a substrate processed using a patterning process.

14. The method of claim 1, wherein the values of diffraction radiation are diffraction values obtained from simulation of the measurement of the metrology target.

15. The method of claim 1, wherein the illumination condition comprises wavelength and/or polarization.

16. The method of claim 1, wherein the illumination condition comprises angle of incidence with respect to the target.

17. The method of claim 16, wherein the plurality of values of diffraction radiation include those which each relate to a corresponding image, each of the images corresponding to a different non-overlapping illumination profile of the illumination radiation.

18. The method of claim 17, wherein the images include one or more derived images, each of the one or more derived images being obtained from a linear combination of two or more acquired images so as to remove information relating to portions of an acquisition illumination profile of at least one of the acquired images which overlaps with an acquisition illumination profile relating to another of the acquired images, the acquisition illumination profiles comprising the actual illumination profiles used in acquisition of the acquired images.

19. A non-transitory computer program product comprising machine-readable instructions that, when executed by a processor system, are configured to cause the processor system to at least:
   obtain a plurality of values of diffraction radiation from a metrology target, each value of the plurality of values corresponding to a different illumination condition of a plurality of illumination conditions of illumination radiation for the target; and
   use the combination of values to determine a same value of a patterning process parameter for the target by solving of a system of equations comprising each of the plurality of illumination conditions as a variable of at least one equation of the system of equations.

20. A system comprising:
   an inspection apparatus configured to provide a beam of radiation on a metrology target on a substrate and to detect radiation diffracted by the target; and
   the non-transitory computer program product of claim 19.

21. The system of claim 20, further comprising a lithographic apparatus comprising a support structure configured to hold a patterning device to modulate a radiation beam and a projection optical system arranged to project the modulated radiation beam onto a radiation-sensitive substrate.

22. A non-transitory computer program product comprising machine-readable instructions that, when executed by a processor system, are configured to cause the processor system to at least:
   obtain a plurality of values of diffraction radiation from a metrology target, each value of the plurality of values corresponding to each of at least four different illumination conditions of illumination radiation for the target, each of the at least four different illumination conditions being of same illumination parameter type; and use the combination of values to determine a same value of a patterning process parameter for the target.

23. The computer program product of claim 22, further solving a system of equations comprising each of the at least four different illumination conditions as a variable of at least one equation of the system of equations.

* * * * *